US012531513B2

(12) United States Patent
Sahu et al.

(10) Patent No.: US 12,531,513 B2
(45) Date of Patent: Jan. 20, 2026

(54) CRYSTAL OSCILLATOR WITH ON-CHIP NEGATIVE RESISTANCE MARGIN MEASUREMENT CIRCUIT

(71) Applicant: NXP B.V., Eindhoven (NL)

(72) Inventors: Siyaram Sahu, Bari Raisen (IN); Anand Kumar Sinha, Noida (IN); Mohamed Suleman Moosa, Austin, TX (US); Joe Chayachinda, Austin, TX (US); Ateet Omer, Kanpur (IN); Ngoc Kim Huynh, Austin, TX (US)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 18/731,421

(22) Filed: Jun. 3, 2024

(65) Prior Publication Data

US 2025/0323601 A1    Oct. 16, 2025

(30) Foreign Application Priority Data

Apr. 15, 2024   (IN) .............................. 202441030115

(51) Int. Cl.
  *H03B 7/06*      (2006.01)
  *H03B 5/06*      (2006.01)
  *H03B 5/36*      (2006.01)

(52) U.S. Cl.
  CPC ................ *H03B 7/06* (2013.01); *H03B 5/06* (2013.01); *H03B 5/364* (2013.01)

(58) Field of Classification Search
  CPC ............. H03B 7/06; H03B 5/06; H03B 5/364
  See application file for complete search history.

(56) References Cited

U.S. PATENT DOCUMENTS

| 5,805,029 A | 9/1998 | Theus et al. |
| 9,071,194 B1 * | 6/2015 | Djahanshahi ............ H03B 5/36 |
| 11,329,608 B1 | 5/2022 | Jefremow et al. |
| 2015/0028956 A1 | 1/2015 | Okamoto |
| 2019/0007005 A1 * | 1/2019 | Marques ................ H03B 5/364 |
| 2022/0131499 A1 * | 4/2022 | Jefremow ................ H03B 5/36 |

FOREIGN PATENT DOCUMENTS

| CN | 104237763 A | 12/2014 |
| EP | 2833545 A1 | 2/2015 |

* cited by examiner

*Primary Examiner* — Jeffrey M Shin

(57) ABSTRACT

Embodiments of methods and semiconductor devices are described that are configured to determine a negative resistance margin (NRM) of an oscillator circuit. The semiconductor device may include an integrated circuit including an amplifier circuit coupled between a first node and a second node and NRM test circuitry including a resistor circuit selectively coupled between a first contact pad and the first node. The integrated circuit may receive an oscillating signal from an oscillator circuit coupled to the first contact pad and a second contact pad of the integrated circuit. In an NRM test mode, a resistance of the resistor circuit is selectively varied from an initial resistance value to one or more second resistance values and the oscillating signal is monitored at the second node to determine the NRM based on the one or more second resistance values when an amplitude of the oscillating signal falls below a threshold amplitude.

19 Claims, 10 Drawing Sheets

CRYSTAL OSCILLATOR WITH ON-CHIP NEGATIVE RESISTANCE MARGIN MEASUREMENT CIRCUIT

CROSS-REFERENCE TO RELATED APPLICATIONS

This application claims the priority under 35 U.S.C. § 119 of India patent application Ser. No. 20/2441030115, filed on Apr. 15, 2024, the contents of which are incorporated by reference herein.

DESCRIPTION

Field of Use

The present disclosure generally relates to measuring a negative resistance margin for crystal oscillators, and more particularly to a crystal oscillator with an on chip negative resistance margin measurement circuit.

Background

Microcontrollers and processors may utilize oscillator circuits that include resonators, such as quartz crystals or ceramic resonators, to generate clock signals. In some examples, a microcontroller or processor may be sold without the resonator, and a manufacturer may install the resonator in a system that includes the microcontroller or processor. The manufacturer may have difficulty predicting oscillator performance issues that may occur in a circuit board due to, for example, process variations of the microcontroller and temperature dependence of the system including the circuit board and the resonator.

To compensate for such variations, integrated crystal oscillator circuits are designed to operate and start with some margin over the crystal losses. The crystal oscillator margin is defined by a ratio of negative resistance generated by an amplifier circuit (|−Rneg|) to the equivalent series resistance of the crystal (Rs), which ratio is commonly known as negative resistance margin (NRM) of the crystal oscillator circuit.

The oscillator circuit can work with negative resistance margin close to unity in steady state, however the lower margin tends to a large startup time and sometimes failure in oscillations due to other environment variables such as circuit board parasitics, non-ideal load capacitors, non-uniform crystal soldering, other variables, or any combination thereof. Therefore, crystal oscillators are often designed to have a negative resistance margin of five times to ten times (5× to 10×) more than a required negative resistance. Typically, the negative resistance margin is guaranteed by simulation across PVT (process, voltage, and temperature) due to the complex test setup in bench and specific board requirements.

BRIEF DESCRIPTION OF THE DRAWINGS

The detailed description is set forth with reference to the accompanying figures. In the figures, the left-most digit(s) of a reference number identifies the figure in which the reference number first appears. The use of the same reference numbers in different figures and in the detailed description indicates similar or identical items or features.

While implementations are described in this disclosure by way of example, those skilled in the art will recognize that the implementations are not limited to the examples or figures described. Rather, the figures and detailed description thereto are not intended to limit implementations to the form disclosed, but instead the intention is to cover all modifications, equivalents, and alternatives falling within the spirit and scope as defined by the appended claims. The headings used in this disclosure are for organizational purposes only and are not meant to limit the scope of the description or the claims. As used throughout this application, the word "may" is used in a permissive sense (in other words, the term "may" is intended to mean "having the potential to") instead of in a mandatory sense (as in "must"). Similarly, the terms "include," "including," and "includes" mean "including, but not limited to."

DETAILED DESCRIPTION

Embodiments of circuits and methods are described below that may include a negative resistance margin (NRM) test circuit that is internal to the system on a chip. In one or more embodiments, the NRM test circuit may enable testing across various processes, voltages, and temperatures (PVT) to determine the NRM, which may be used to configure appropriate gain settings for an associated amplifier circuit.

In one or more embodiments, the on-chip NRM test circuit may include a tunable internal capacitor circuit, which may be used as part of a load capacitance during testing. In one or more embodiments, the on-chip NRM test circuit may include a tunable internal resistor circuit, which may be varied to perform NRM testing. In one or more implementations, the effect of pad resistance can be reduced or eliminated during testing. In one or more embodiments, the on-chip NRM test circuit may be used to determine the gain setting for an amplifier to provide a selected NRM for a new crystal.

In one or more embodiments, the circuit including the NRM test circuit may enable reduced validation times and may determine the negative resistance reading and correlation with design simulations. In one or more embodiments, the on-chip NRM test circuitry is inside the oscillation loop to improve the accuracy of the NRM measurement with only a pair of contact pads to couple the external oscillator circuit to the chip. An example of a system including an integrated circuit with the on-chip NRM test circuitry is described below with respect to FIG. 1.

Figure 1:
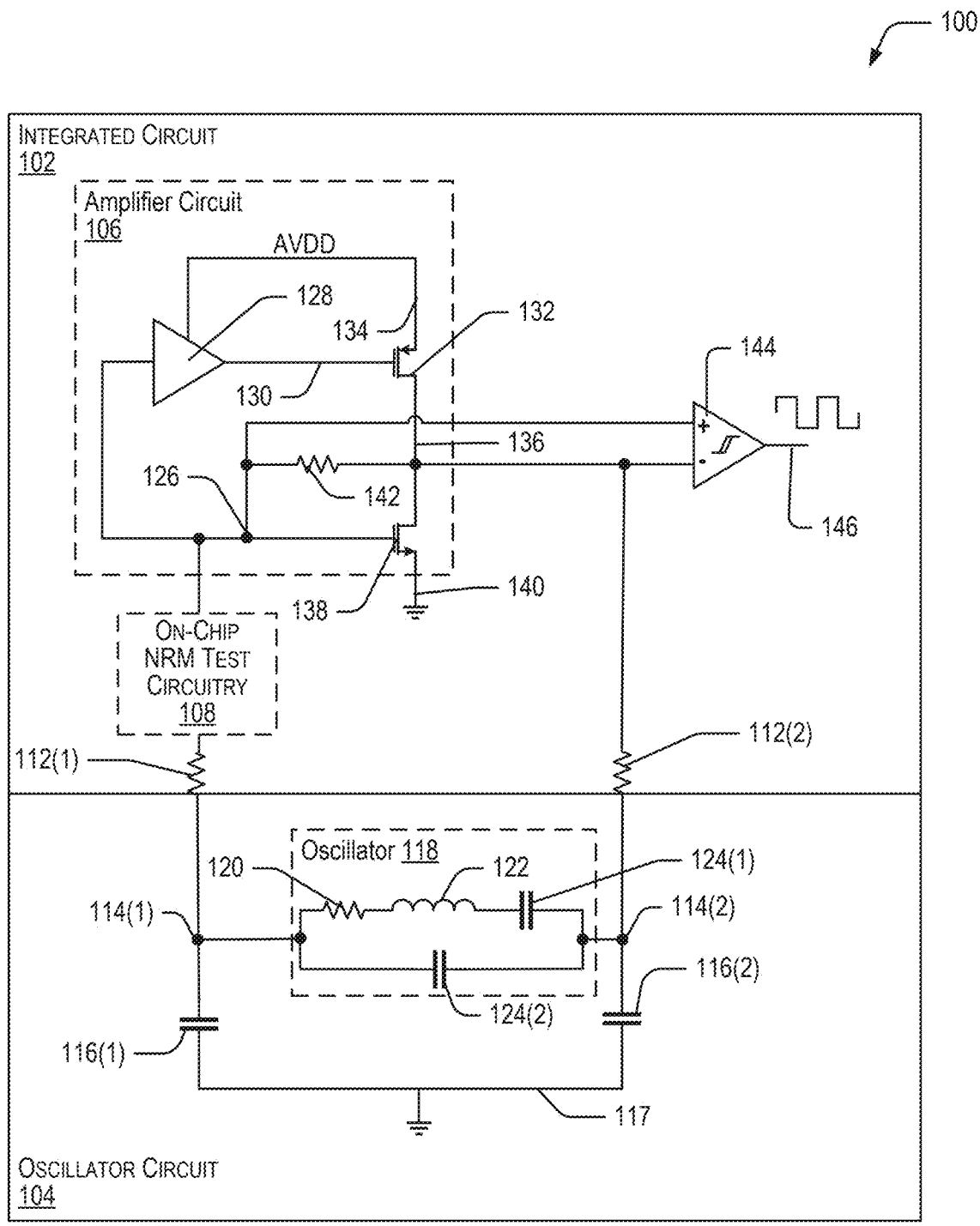
FIG. 1 depicts a system including an external oscillator circuit coupled to an integrated circuit with an on-chip amplifier coupled to on-chip configurable test circuitry to determine a negative resistance margin, in accordance with an embodiment of the present disclosure.

FIG. 1 depicts a system 100 including an external oscillator circuit 104 coupled to an integrated circuit 102 with an on-chip amplifier 106 coupled to on-chip configurable negative resistance margin (NRM) test circuitry 108 to determine a negative resistance margin, in accordance with an embodiment of the present disclosure. In the illustrated example, the oscillator circuit 104 is coupled to the crystal oscillator amplifier 106 at least partially through the on-chip NRM test circuitry 108.

The oscillator circuit 104 may be external to the integrated circuit 102 and may be coupled to the integrated circuit 102 by contact pads, which are represented by pad resistors 112(1) and 112(2). In one or more embodiments, the integrated circuit 102 and the oscillator circuit 104 may be coupled to a circuit substrate, such as a printed circuit board (PCB), and the oscillator circuit 104 may be coupled to the integrated circuit 102 by solder connections formed on the contact pads.

The oscillator circuit 104 may include an oscillator 118 coupled between a first node 114(1) and a second node 114(2). The first node 114(1) may be coupled to the first pad resistor 112(1) and to a first terminal of a first load capacitor 116(1), which may have a second terminal coupled to ground 117 (or to a negative supply voltage (Vss)). The second node 114(1) may be coupled to the second pad resistor 112(2) and to a first terminal of a second load capacitor 116(2), which may have a second terminal coupled to ground 117 (or to the negative supply voltage (Vss)).

The oscillator 118 may be implemented as a crystal oscillator 118, a crystal resonator, a ceramic resonator, or another type of resonator. The oscillator 118 is configured to produce a periodic, oscillating (or alternating current) signal, such as a sine wave, a square wave, or a triangle wave having a selected period that can be used to synchronize operations of the integrated circuit 102. The oscillator 118 may be represented a resonant inductor/capacitor (LC) circuit including a resistor 120, an inductor 122, and a first capacitor 124(1) in series between the first node 114(1) and the second node 114(2) and a second capacitor 124(2) coupled between the first node 114(1) and the second node 114(2) (in parallel with the resistor 120, the inductor 122, and the first capacitor 124(1)). In this example, the resistor 120 may represent a lead resistance of the wire traces and/or loss of the resonator.

In the illustrated example, the resistor 120 may include a first terminal coupled to the node 114(1) and may include a second terminal coupled to a first terminal of the inductor 122. The inductor 122 may include a second terminal coupled to a first terminal of the first capacitor 124(1), which may have a second terminal coupled to the second node 114(2). The second capacitor 124(2) may include a first terminal coupled to the first node 114(1) and a second terminal coupled to the second node 114(2). The oscillator circuit 104 may be coupled to conductive pads associated with the integrated circuit 102.

The oscillation by the oscillator 118 may be started and sustained by an active circuit, which provides a negative resistance. The size of the negative resistance may be partially dictated by the capacitance of the second capacitor 124(2). Initially, the capacitor 124(1) discharges through the inductor 122, converting electrical energy into an electromagnetic field stored in the inductor 122. When the capacitor is fully discharged, the stored electromagnetic field generates a back electromotive force (back-EMF) causing current to continue to flow in the same direction. The electromagnetic field of the inductor 122 collapses and converts to electrical energy, and the capacitor 124(1) charges with the opposite polarity. As a result, an oscillating waveform emerges as the output. To maintain continuous and constant-amplitude oscillations, an amplifier circuit 106 may be provided to compensate for energy losses. To maintain the oscillations, the energy supplied should match the energy lost. If the supplied energy exceeds the losses, the oscillation amplitude may increase resulting in distortion. If the energy supplied is less than the losses, the oscillations degrade until the oscillator 118 stops producing oscillations.

The integrated circuit 102 may include the pad resistors 112(1) and 112(2). The integrated circuit 102 may include the amplifier circuit 106 coupled to the first pad resistor 112(1) at a first node 126 through the on-chip NRM test circuitry 108 and coupled to the second pad resistor 112(2) at a node 136. The on-chip NRM test circuitry 108 may be used to determine the resistance margin to control the amplifier circuit 106 to provide a gain that is sufficient to offset the losses to maintain the oscillations without saturating the amplifier circuit 106.

The oscillator amplifier circuit 106 may include an amplifier including an input coupled to the node 126, an input coupled to a node 134, and an output 130 that is coupled to a gate of a transistor 132. In this example, the transistor 132 is depicted as a P-channel metal oxide semiconductor device including a source coupled to the node 134, a gate coupled to the output 130, and a drain coupled to the node 136. The oscillator amplifier circuit 106 may include a transistor 138 including a drain coupled to the node 136, a gate coupled to the node 126, and a source coupled to ground 140 (or to a negative supply voltage (Vss)). The oscillator amplifier 106 may include a resistor 142 including a first terminal coupled to the node 126 and a second terminal coupled to the node 136.

The integrated circuit 102 may include a comparator 144 including a first input (e.g., a positive input) coupled to the node 126, a second input (e.g., a negative input) coupled to the node 136, and an output 146. The comparator 144 is configured to provide an output signal to an output 146. The output signal may be a clock signal based on the signal produced by the oscillator 118.

In some embodiments, the oscillator circuit 104 can work with a negative resistance margin close to one in a steady state; however, a negative resistance margin of one is relatively low and tends to result in a large startup time and sometimes failure in oscillations due to other environment variables, such as board parasitic, non-ideal load capacitors, non-uniform crystal soldering, other variables, or any combination thereof. Therefore, an integrated circuit 102 that uses the oscillator circuit 104 may be designed to have a selected negative resistance margin that is greater than one (1) to achieve a reliable start-up. Conventionally, the integrated circuit 102 or the oscillator circuit 104 may be designed to provide a negative resistance margin that is five times to ten times (5×-10×) greater than unity, in part, to account for the unknown environmental variables that can impact the NRM.

In one or more embodiments, the integrated circuit 102 includes on-chip NRM test circuitry 108 configured to test the NRM of the amplifier circuit 106, in situ, to provide one or more measurements of the NRM. The on-chip NRM test circuitry 108 may include variable resistor circuitry, variable capacitor circuitry, other circuits, or any combination thereof, which may be coupled between the oscillator 118 and the amplifier circuit 106. The on-chip NRM test circuitry 108 may be adjusted to vary one or more of a resistance margin and the load capacitance at the node 126 of the amplifier circuit 106.

In one or more embodiments, the load capacitance of the on-chip NRM test circuitry 108 may be adjusted until a frequency error of the output signal is approximately zero parts per million. With the load capacitance configured, the resistance margin may be increased from zero incrementally until the output signal degrades to a level that is below a predetermined threshold. The value of the resistance margin when the output signal degrades may be used, in conjunction with the resistance of the resistor 120 and one or more of the resistors 120, may define the negative resistance of the oscillator circuit 104. The negative resistance of the oscillator circuit 104 is the maximum resistance in series with the oscillator 118 before the signal at the output 146 degrades below the threshold level. The NRM may be determined as a ratio of the negative resistance to the equivalent series resistance of the oscillator 118.

Conventionally, a validation board configured to determine the NRM uses two oscillators and two sets of load capacitors. A first oscillator with associated load capacitors may be a primary oscillator circuit that is used to provide the oscillating signal in an application mode. A second oscillator with associated load capacitors may provide a secondary oscillator circuit that is used for the NRM testing. To test the NRM on the validation board, the primary oscillator circuit is decoupled from the circuit board and the secondary oscillator circuit is coupled to the circuit board, which procedure involves multiple iterations of soldering and de-soldering, which can result in non-repeatability in the behavior of the primary or secondary oscillator circuits. Sometimes, the circuit board can be damaged due to the multiple soldering and de-soldering of different board components for the NRM test. Additionally, the secondary oscillator circuit may occupy significant real estate on the validation board. Moreover, conductor length contributes series resistance (additional parasitic variables) to the circuit, placing constraints on the electrical routing, which can make it difficult to accommodate the secondary oscillator circuit near to the contact pads or pins of the integrated circuit 102, which can adversely impact the accuracy of the measurement of the NRM.

In one or more embodiments, by providing the on-chip NRM test circuitry 108 on the integrated circuit 102, the layout issues, the multiple oscillator circuits issue, the electrical conductor variability issues, and other variables are reduced or eliminated. In this example, the amplifier circuit 106 provides negative resistance to the oscillator circuit 104 to compensate the losses due to non-zero series resistance of the oscillator 118. The series connection of the resistor 120, the inductor 122, and the capacitor 124(1) with the parallel capacitance of the capacitor 124(2) provides a resonant tank that may generate oscillating signals, which may be used by the integrated circuit 102 to produce a stable clock signal, provided that the NRM provided by the amplifier circuit 106 can be configured to provide a desired negative resistance margin across the oscillator 118. The gain (more specifically the transconductance) of the amplifier circuit 106 along with the load capacitance provided by the load capacitors 116(1) and 116(2) forms the negative resistance margin across the oscillator circuit 118, allowing the oscillations to grow if there is sufficient negative resistance margin.

The equivalent series resistance (ESR) of the oscillator 118 may be determined according to the following equation.

$$ESR = R_{120} \times \left(1 + \frac{c_{124(2)}}{c_{116(2)}}\right)^2 \quad (1)$$

Since the capacitance of the capacitor 116(1) or 116(2) is much greater than the capacitance of the capacitor 124(2), the value of the fraction is approximately equal to zero. Accordingly, the ESR is approximately equal to the motional resistance of the oscillator 118. In this example, the negative resistance (−Rneg) is provided by the integrated circuit 102 (the resistance provided by the amplifier circuit 106). The negative resistance margin may be defined as follows:

$$NRM = \frac{|-Rneg|}{ESR} \quad (2)$$

Typically, the maximum resistance or loss of the oscillator 118 represented by the resistor 120 varies from about thirty ohms (30Ω) to about two hundred ohms (200Ω) for an oscillator 118 that provides a signal that has a frequency in a megahertz (MHz) range and varies from about thirty kiloohms (30 kΩ) to about ninety kiloohms (90 kΩ) for an oscillator 118 that provides a signal that has a frequency in a kilohertz (kHz) range. The total negative resistance may be determined as follows:

$$|-Rneg| = R_{108} + R_{120} \quad (3)$$

where the resistance ($R_{108}$) refers to the resistance margin provided by varying a resistance provided by the on-chip NRM test circuitry 108.

In one or more embodiments, to determine the negative resistance of the integrated circuit 102 (including the resistance of the pad resistors 112 and the resistance of the amplifier circuit 106), the on-chip NRM test circuitry 108 may be controlled to vary a resistance to adjust the negative resistance (−Rneg) until oscillations across the oscillator 118 and at the output 146 degrade below a threshold amplitude or until the capability of the amplifier circuit 106 to produce a negative resistance between the node 136 and the node 126 saturates. In some embodiments, the negative resistance (−Rneg) is calculated based on the value of the resistance provided by the on-chip NRM test circuitry 108 when the loop gain falls below zero decibels (0 dB).

In one or more embodiments, the oscillator 118 may be activated and the NRM testing may be delayed until the oscillations reach a steady state. In one or more embodiments, the on-chip NRM test circuitry 108 may be controlled to provide a selected load capacitance that provides a center frequency offset relative to a desired carrier frequency (i.e., a frequency error) of approximately zero in units of parts per million (0 ppm). Once the frequency error is tuned to approximately zero, the on-chip NRM test circuitry 108 may be controlled to adjust a resistance until the oscillations degrade below a threshold level. The value of the resistance when the oscillations degrade may be determined to be the negative resistance. The NRM may be calculated as the ratio of the negative resistance over an equivalent series resistance of the oscillator 118.

In one or more embodiments, the load capacitors 116 and any variable resistance can be included in the on-chip NRM test circuitry 108 of the integrated circuit 102, which may eliminate board rework and manual testing as compared to conventional oscillator circuits that include such circuitry. An example of an embodiment of an integrated circuit is described below with respect to FIG. 2 in which the load capacitors and a variable resistance are provided within the on-chip NRM test circuitry 108 of the integrated circuit 102.

Figure 2:
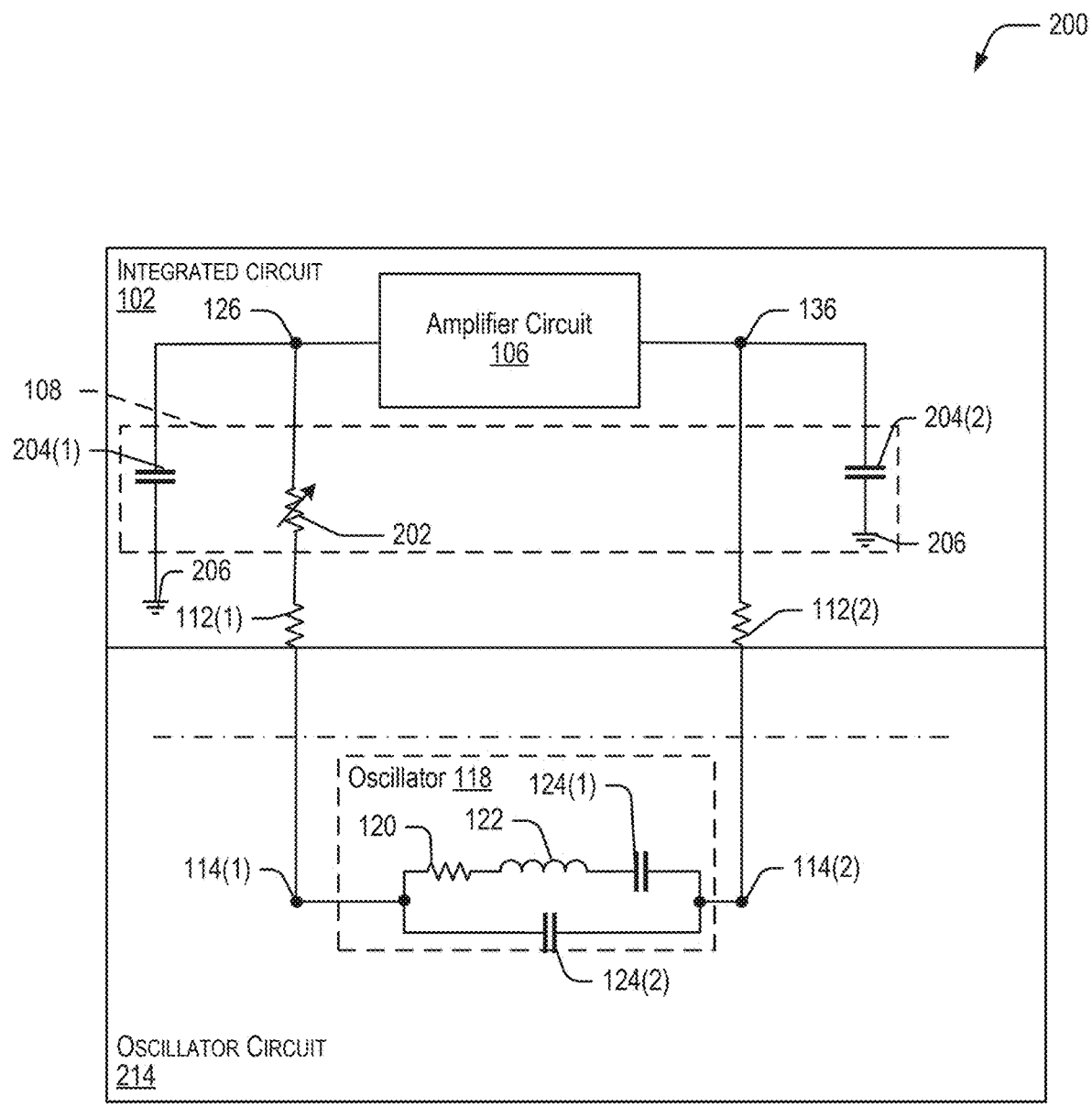
FIG. 2 depicts an embodiment of a system including an integrated circuit with on-chip configurable test circuitry including a variable resistor and on-chip load capacitors configured to determine a negative resistance margin, in accordance with an embodiment of the present disclosure.

FIG. 2 depicts an embodiment of a system 200 including an integrated circuit 102 with on-chip NRM test circuitry 108 including a variable resistor 202 and on-chip load capacitors 204(1) and 204(2) configured to determine the NRM, in accordance with an embodiment of the present disclosure. In the illustrated example, the system 200 includes an oscillator circuit 214 that includes the oscillator 118 coupled between the first node 114(1) and the second node 114(2). Unlike the oscillator circuit 104 of FIG. 1, the oscillator circuit 214 does not include the load capacitors 116. Instead, load capacitors 204 are provided on the integrated circuit 102 as part of the on-chip NRM test circuit 108.

In the illustrated example, the integrated circuit 102 includes the on-chip NRM test circuitry 108. The on-chip NRM test circuitry 108 may include a variable resistor 202 or one or more selectable resistors coupled between the resistor 112(1) and the first node 126. As mentioned above with respect to FIG. 1, the resistors 112(1) and 112(2) represent the pad resistances provided by the contact pad to which the external board 204 is coupled. The variable resistor 202 (or the one or more selectable resistors) may be configured to provide a selected resistance between the contact pad (resistor 112(1)) and the first node 126. The on-chip NRM test circuitry 108 may include one or more load capacitors 204(1) coupled between the first node 126 and ground 206 (or a negative supply voltage (Vss)). The on-chip NRM test circuitry 108 may include one or more load capacitors 204(2) coupled between the second node 136 and ground 206 (or the negative supply voltage (Vss)).

In the illustrated example, the resistance across the amplifier circuit 106 and the load capacitors 204 includes the resistors 112(1), 112(2), and 120. In a case where the lead resistance/loss of the oscillator 118 represented by the resistor 120 is fifty ohms (50Ω) for example, the total resistance across the amplifier circuit 106 and the load capacitors 204 may be approximately two hundred fifty ohms (250Ω), assuming contact pad resistances (represented by resistors 112(1) and 112(2)) are approximately one hundred ohms (100Ω). In this example, the amplifier circuit 106 may be configured according to the two hundred fifty ohms (250Ω) resistance instead of the fifty ohms (50Ω) lead resistance. This solution may be used with an oscillator 118 in the kilohertz frequency range where the lead resistance/loss of the oscillator 118 represented by the resistor 120 is in a range of thirty kiloohms to ninety kiloohms (30 kΩ to 90 kΩ).

The negative resistance may be determined by activating the oscillator 118 and waiting for the oscillator to reach a steady state. In one or more embodiments, once the steady state is reached, the variable resistor 202 may be adjusted until the oscillations degrade below a threshold amplitude. The resistance of the variable resistor 202 may be used as the negative resistance, and the NRM may be determined based on the negative resistance. In one or more embodiments, the load capacitors 204 may be programmable with electrostatic discharge (ESD) compliant switches (not shown).

In one or more embodiments, the load capacitor 204 and the variable resistor 202 may be integrated into the contact (input/output or I/O) pads. An example embodiment of the integrated circuit 102 with the on-chip NRM test circuitry 108 integrated into the I/O pads is described below with respect to FIG. 3.

Figure 3:
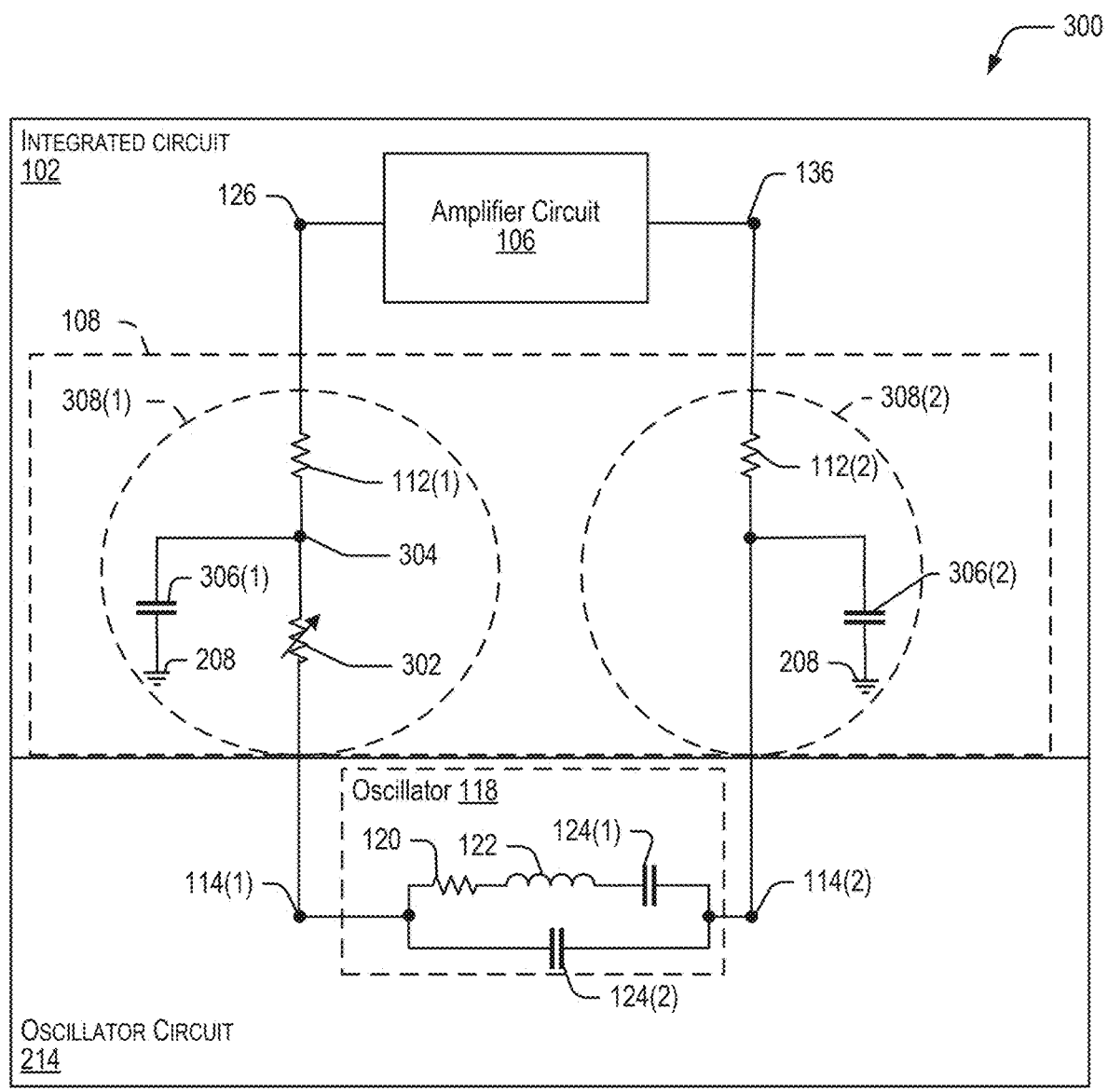
FIG. 3 depicts an embodiment of a system including an integrated circuit with on-chip configurable test circuitry including a variable resistor and on-chip load capacitors configured to determine a negative resistance margin that are integrated in input/output pads, in accordance with an embodiment of the present disclosure.

FIG. 3 depicts an embodiment of a system 300 including an integrated circuit 102 with on-chip NRM test circuitry 108 including a variable resistor 302 and on-chip load capacitors 306 configured to determine a negative resistance margin that are integrated in input/output (I/O) pads 308, in accordance with an embodiment of the present disclosure. The integrated circuit 102 may be coupled to the oscillator circuit 214 to receive an oscillating signal from the oscillator 118.

In this example, the I/O pad 308(1) may include one or more variable resistors 302 coupled between the node 114(1) and a node 304. The I/O pad 308(1) may include a capacitor 306(1) coupled between the node 304 and ground 208 (or a negative supply voltage (Vss)). The I/O pad 308(1) may include a resistor 112(1) coupled between the node 304 and the first node 126. The resistor 112(1) may represent the pad resistance of the I/O pad 308(1).

The I/O pad 308(2) may include a capacitor 306(2) coupled between the node 114(2) and ground 208 (or a negative supply voltage (Vss)). The I/O pad 308(2) may include a resistor 112(2) coupled between the node 114(2) and the node 136.

In the illustrated example, the on-chip NRM test circuitry 108 may include the I/O pads 308(1) and 308(2). The capacitors 306(1) and 306(2) may be programmable with ESD compliant switches (not shown). In one or more embodiments, the one or more resistors 302, the load capacitors 306 and any pad resistance (e.g., resistors 112) are part of the I/O pads 308. If the technology allows, the pad resistance represented by the resistors 112 may be approximately zero, and the resistance margin resistor (represented by the one or more variable resistors 302) may be part of the I/O pad 308(1).

Similar to the embodiment in FIG. 2, the integrated circuit 102 with the integrated load capacitors 306 may provide better control over the NRM testing, enabling more accurate NRM measurements. In one or more embodiments, a tunable internal capacitance may be provided on-chip together with an on-chip programmable resistor circuit to test the NRM. An example embodiment of such a structure is described below with respect to FIG. 4.

Figure 4:
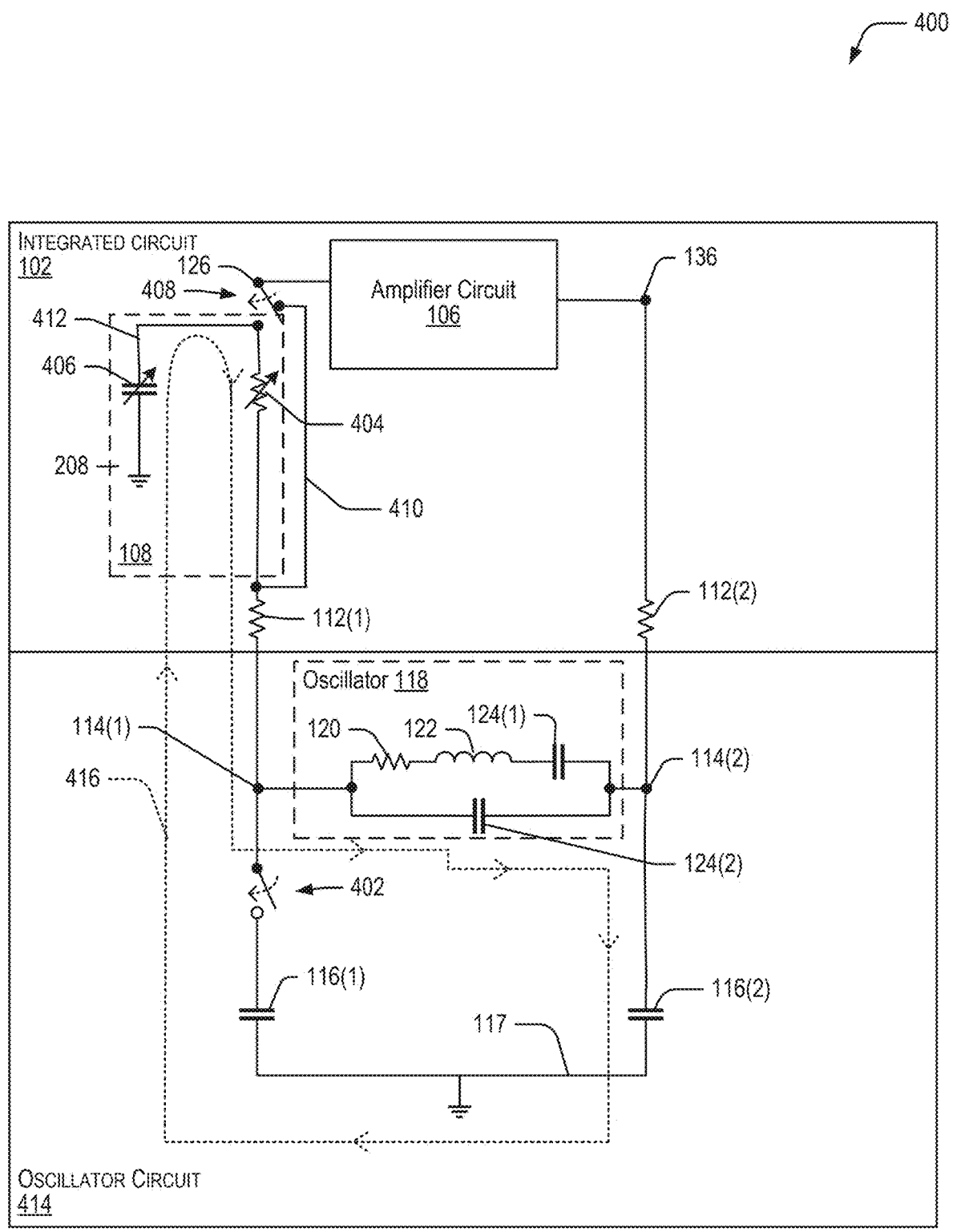
FIG. 4 depicts an embodiment of a system including an integrated circuit with on-chip configurable test circuitry including a tunable internal capacitor and a programmable internal resistor circuit to determine a negative resistance margin, in accordance with an embodiment of the present disclosure.

FIG. 4 depicts an embodiment of a system 400 including an integrated circuit 102 with an on-chip NRM test circuit 108 including a tunable internal capacitor circuit 406 and a programmable internal resistor circuit 404 configured to determine the NRM, in accordance with an embodiment of the present disclosure. In the illustrated embodiment, the integrated circuit 102 may be coupled to an oscillator circuit 414, which may supply an oscillating signal to the integrated circuit 102.

The oscillator circuit 414 may include the oscillator 118 coupled between the first node 114(1) and the second node 114(2). The oscillator circuit 414 may include a first capacitor 116(1) including a first terminal coupled to ground 117 (or to a negative supply voltage (Vss)) and including a second terminal. The oscillator circuit 414 may include a switch 402 including a first terminal coupled to the second terminal of the first capacitor 116(1) and including a second terminal coupled to the first node 114(1). The switch 402 may be controlled to selectively couple the capacitor 116 to the first node 114(1). In one or more embodiments, the switch 402 may be response to a control signal to selectively couple the first capacitor 116(1) to the first node 114(1).

The oscillator circuit 414 may include a second capacitor 116(2). The second capacitor 116(2) may include a first terminal coupled to ground 117 (or to a negative supply voltage (Vss)) and may include a second terminal coupled to the second node 114(2). The oscillator circuit 414 may provide an oscillating signal to the integrated circuit 102.

In the illustrated embodiment, the integrated circuit 102 may include an on-chip NRM test circuit 108. The integrated circuit 102 may include a first contact pad represented by a first resistor 112(1) coupled between the node 114(1) and the on-chip NRM test circuit 108. The integrated circuit may include a second contact pad represented by a second resistor 112(2) coupled between the second node 114(2) and the node 136.

The on-chip NRM test circuit 108 may include one or more resistors represented by variable resistor 404 including a first terminal coupled to the first resistor 112(1) and a second terminal coupled to a node 412. The on-chip NRM test circuit 108 may include one or more capacitors represented by variable capacitor 406 coupled between the node 412 and ground 208 (or a negative supply voltage (Vss)).

The integrated circuit 102 may include a bypass signal path 410 that is coupled to the first resistor 112(1). The integrated circuit 102 may include one or more switches (or gates) 408 configured to selectively couple one of the nodes 412 or the bypass signal path 410 to the node 126. The one or more switches (or gates) 408 may provide an illustrative example of an electronic device that may change its state in response to a control signal, such as a voltage level. Such devices may include tri-state switches, transistor devices, or logic circuitry including transistors, latches, other circuits, or any combination thereof.

In one or more embodiments, in an operating mode, the switch 402 is controlled to couple the first capacitor 116(1) to the first node 114(1) and the one or more capacitors (variable capacitor 406). In the operating mode, the one or more resistors (variable resistor 404) may be bypassed using the bypass signal path 410 by closing the switch 408 between the node 126 and the bypass signal path 410.

In one or more embodiments, in an NRM test mode, the switch 402 may be opened to decouple the first capacitor 116(1) from the first node 114(1). In the NRM test mode, and the switch 408 may be controlled to couple the node 412 to the node 126. The one or more capacitors (variable capacitor 406) may be tuned so that a frequency error in the output signal at the node 136 is approximately zero parts per million (0 ppm) while the one or more resistors (variable resistor 404) is approximately zero ohms (0Ω). The value of the one or more capacitors (variable capacitor 406) when the frequency error is approximately zero may provide an appropriate value of a load capacitance for the oscillator 118 during the NRM test.

Once the capacitance is determined, the resistance of the one or more resistors (variable resistor 404) may be increased incrementally until an amplitude of the oscillations falls below a threshold amplitude. The minimum resistance of the variable resistor 404 at which the oscillations degrade represents the resistance margin (R_margin or $R_{404}$). The negative resistance (−Rneg) of the oscillator circuit 414 may be determined according to the following equation:

$$|-Rneg| = R_{404} + R_{112(1)} + R_{120} \qquad (4)$$

where the resistance $R_{112(1)}$ is the value of the contact pad resistance (resistor 112(1)) and the resistance $R_{120}$ is the resistance of the leads of the oscillator 118.

In one or more embodiments, in the NRM test mode, the resistance across the load capacitors (variable capacitor 406 and load capacitor 116(2)) may include the lead resistance/loss of the oscillator 118 as represented by the resistor 120 and the resistor 112(1). The test signal path is generally represented by the dotted path 416.

In one or more embodiments, the second resistor 112(2) may be programmable and may be programmed to have a zero-ohm resistance in the test mode. To enable this zero-ohm resistance and to protect the devices at the interface from electrostatic discharge (ESD) events, the integrated circuit 102 may include ESD protection circuitry as shown and described with respect to FIG. 5.

Figure 5:
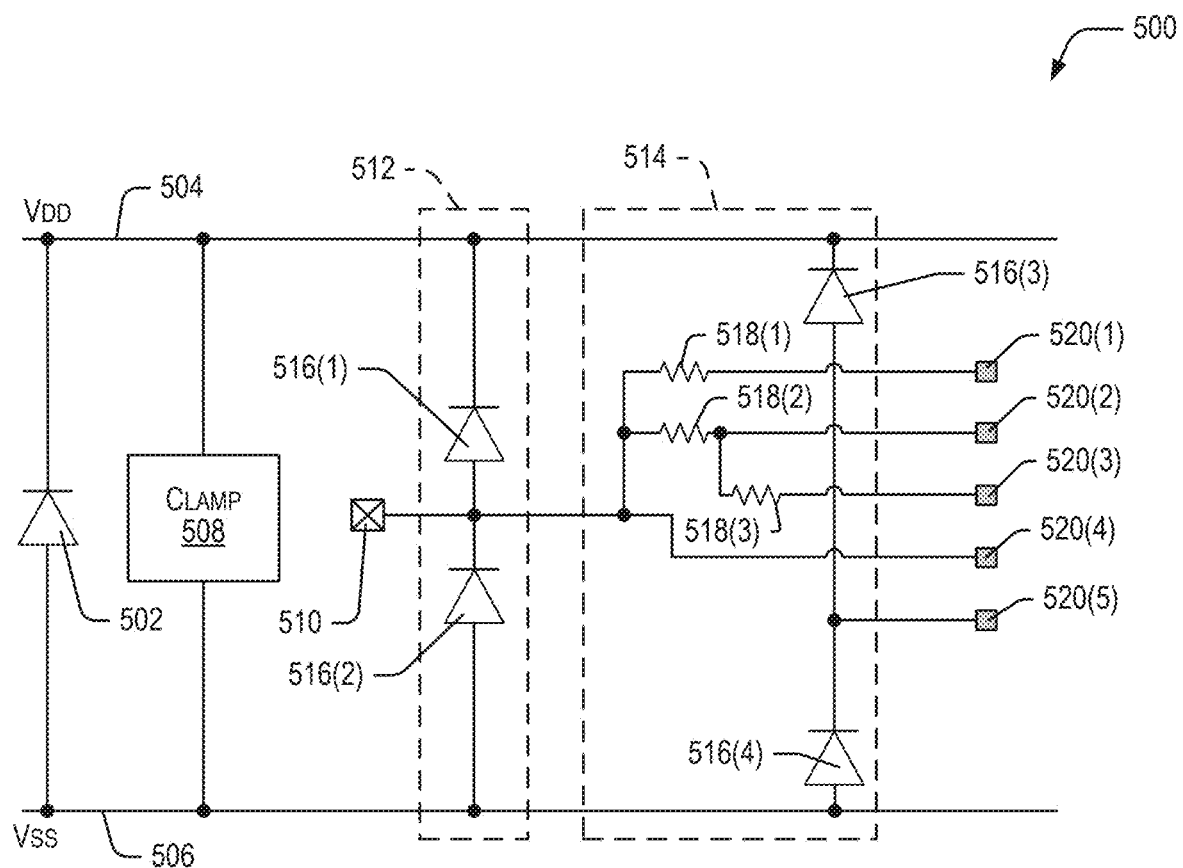
FIG. 5 depicts an embodiment of a portion of an analog contact pad of the integrated circuit including a contact pad configured to couple to the external crystal oscillator including pins accessible to configure a selected resistance, in accordance with an embodiment of the present disclosure.

FIG. 5 depicts an embodiment of a portion of an analog contact pad 500 of the integrated circuit 102 including a contact pad 510 configured to couple to the oscillator circuit (such as the oscillator circuits 104, 214, or 414 of any of FIGS. 1-4) including pins 520 accessible to configure a selected resistance, in accordance with an embodiment of the present disclosure. The contact pad 510 may represent one of the contact pads corresponding to the resistors 112(1) or 112(2). In one or more embodiments, the analog contact pad 500 may be configured to couple the contact pad 510 to the node 126 and at least a portion of the analog contact pad 500 may be duplicated to couple a second contact pad 510 to the node 136.

The system 500 may include a first diode 502 including an anode coupled to a second power supply terminal (Vss) 506 and a cathode coupled to a first power supply terminal (VDD) 504. In this example, the second power supply terminal 506 may have a lower voltage potential than the first power supply terminal 504.

The system 500 may include a clamp circuit 508 coupled between the first power supply terminal 504 and the second power supply terminal 506. The clamp circuit 508 may be configured to limit the voltage potential between the first power supply terminal 504 and the second power supply terminal 506 to a selected voltage range.

The system 500 may include a primary ESD protection circuit 512 including a first diode 516(1) and a second diode 516(2). The first diode 516(1) may include an anode coupled to the contact pad 510 and a cathode coupled to the first power supply terminal 504. The second diode 516(2) may include an anode coupled to the second power supply terminal 506 and a cathode coupled to the contact pad 510.

The system 500 may include a secondary ESD protection circuit 514. The secondary ESD protection circuit 514 may include a first diode 516(3) including an anode coupled to a contact pad 520(5) and a cathode coupled to the first power supply terminal 504. The secondary ESD protection circuit 514 may include a second diode 516(4) including an anode coupled to the second power supply terminal 506 and a cathode coupled to the contact pad 520(5).

The system 500 may include a resistor 518(1) including a first terminal coupled to the contact pad 510 and a second terminal coupled to the contact pad 520(1). The system may include a resistor 518(2) including a first terminal coupled to the contact pad 510 and a second terminal coupled to the contact pad 520(2). The system may include a resistor 518(3) including a first terminal coupled to the contact pad 520(2) and a second terminal coupled to the contact pad 520(3). In the illustrated embodiment, the contact pad 510 is connected directly to contact pad 520(4).

In the illustrated embodiment, there are multiple signal paths that can be used. In one or more embodiments, in the operating mode, the contact pad 520(2) may be enabled such that the signals from the oscillator 118 received at the contact pad 510 are delivered to the node 126 through the resistor 518(2) and the contact pad 520(2). Additionally, in one or more embodiments, the contact pad 520(5) may also be used in the operating mode. In a test mode, the signals from the oscillator 118 that are received at the contact pad 510 may be delivered to the integrated circuit 102 through the contact pad 520(2), the contact pad 520(4), and the contact pad 520(5).

In one or more embodiments, the zero-ohm contact pad 520(4) may be susceptible to ESD and latch-up failure. Latch-up failure is a functional chip failure associated with excessive current flowing through the chip. While the on-chip NRM test circuitry 108 described below with respect to FIG. 6 may provide one or more transmission gates (T-gates) in the current path making the design robust, primary ESD circuit 512 and secondary ESD circuit 514 help to make the circuit robust for ESD. The T-gates may include the double guard ring protection to prevent latch-up events.

Figure 6:
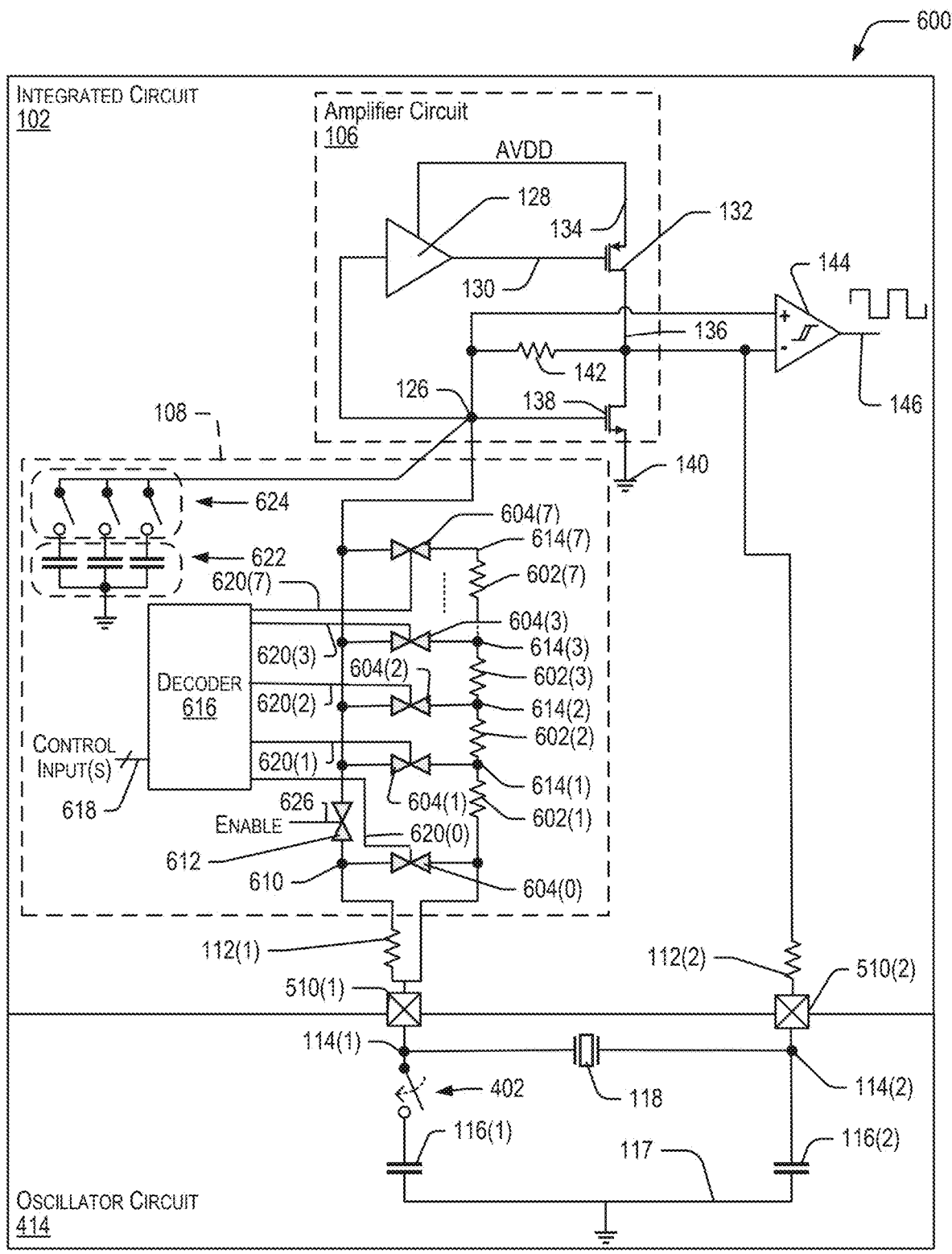
FIG. 6 depicts an embodiment of the system of FIG. 4 including an integrated circuit including on-chip configurable test circuitry including a tunable internal capacitor and a programmable internal resistor circuit to determine a negative resistance margin, in accordance with one or more embodiments of the present disclosure.

FIG. 6 depicts an embodiment 600 of the system 400 of FIG. 4 including an integrated circuit 102 including an on-chip NRM test circuitry 108 with a tunable internal capacitor circuit and a programmable internal resistor circuit to determine a negative resistance margin, in accordance with one or more embodiments of the present disclosure. The integrated circuit 102 may include the on-chip NRM test circuitry 108 coupled between a contact pad 510(1) and the node 126. The contact pad 510(1) may be coupled to the node 114(1). The amplifier circuit 106 may include all the elements described in FIG. 1, and the node 136 may be coupled to a contact pad 510(2), which may be coupled to the node 114(2). The resistors 112(1) and 112(2) may represent the resistance provided by the contact pads 510(1) and 510(2), respectively.

The oscillator circuit 414 includes all the elements of the oscillator circuit 414 in FIG. 4, including the switch 402 that may selectively decouple the capacitor 116(1) from the node 114(1) during an NRM test mode. In the illustrated embodiment 600, the on-chip NRM test circuitry 108 may include one or more switches 624 to selectively adjust a capacitance provided by one or more capacitors 622. The on-chip NRM test circuitry 108 may include one or more T-gates 604 that may be selectively activated by a control signal from a decoder 616 to provide a selected signal path from the contact pad 510(1) to the node 126.

The on-chip NRM test circuit 108 may include a plurality of resistors 602 arranged in series between the contact pad 510(1) a node 614(7). The on-chip NRM test circuit 108 may include a first resistor 602(0) including a first terminal coupled to the contact pad 510(1) and a second terminal coupled to a node 614(0). The on-chip NRM test circuit 108 may include a second resistor 602(1) including a first terminal coupled to the node 614(0) and a second terminal coupled to a node 614(1). The on-chip NRM test circuit 108 may include a third resistor 602(2) including a first terminal coupled to the node 614(1) and a second terminal coupled to a node 614(2). The on-chip NRM test circuit 108 may include a resistor 602(7) including a first terminal coupled to a node 614(6) (not shown) and a second terminal coupled to the node 614(7).

The on-chip NRM test circuit 108 may include a plurality of T-gates 604 and 612. Each T-gate 604 and 612 may be a bidirectional switch including an n-channel metal oxide semiconductor field effect transistor (MOSFET) and a p-channel MOSFET in parallel. The T-gates 604 and 612 may be configured to conduct in both directions or to block electrical signals in response to an applied voltage potential.

The on-chip NRM test circuit 108 may include a first T-gate 604(1) including a first terminal coupled to the node 614(1), a second terminal coupled to the node 126, and a control terminal coupled to a first output 620(1) of a decoder 616. The on-chip NRM test circuit 108 may include a second T-gate 604(2) including a first terminal coupled to the node 614(2), a second terminal coupled to the node 126, and a control terminal coupled to a second output 620(2) of the decoder 616. The on-chip NRM test circuit 108 may include a third T-gate 604(3) including a first terminal coupled to the node 614(3), a second terminal coupled to the node 126, and a control terminal coupled to a third output 620(3) of the decoder 616. The on-chip NRM test circuit 108 may include fourth, fifth, sixth, and seventh T-gates (not shown) coupled between corresponding nodes 604 and the node 126 and including control terminals coupled to corresponding outputs 620 of the decoder 616. Output signals on the outputs 620 of the decoder 616 may control the T-gates 604 to selectively define a signal path including one or more of the resistors 602 to provide a programmable resistance during an NRM test mode.

The on-chip NRM test circuit 108 may include a T-gate 604(0) including a first terminal coupled to the contact pad 510(1), a second terminal coupled to a bypass node 610, and a control terminal coupled to an output 620(0) of the decoder 616. The on-chip NRM test circuit 108 may include a T-gate 612 including a first terminal coupled to the bypass node 610, a second terminal coupled to the node 126, and a control terminal 626 configured to receive an enable/disable signal. In some implementations, the disable/enable signal may be received from control circuitry (not shown), which may be part of the integrated circuit 102 or which may be coupled to the integrated circuit 102. The decoder 616 may include a control input 618 that may be configured to receive control inputs from the control circuitry (not shown). In one or more embodiments, the control signal may be multi-bit symbols or other control signals, which may be processed by the decoder 616 to generate output signals that can be applied to the outputs 620 to control the T-gates 604.

The on-chip NRM test circuit 108 may include a capacitor circuit 622 with one or more capacitors. Each capacitor of the capacitor circuit 622 may include a first terminal coupled to ground 140 (or to a negative supply voltage Vss) and may include a second terminal. The on-chip NRM test circuit 108 may include one or more switches 624, each of which may selectively couple the second terminal of one of the one or more capacitors to the node 126. One or more of the switches 624 may be selectively activated to couple a corresponding one or more of the capacitors of the capacitor circuit 622 to the node 126 to provide a selected load capacitance during an NRM test mode. During an operating or application mode, the switches 624 may be controlled to decouple the capacitor circuit 624 from the node 126. In one or more embodiments, the switches 624 may be activated by a control signal from the control circuitry (not shown), which may be part of the integrated circuit 102 or which may be coupled to the integrated circuit.

In the illustrated embodiment, the on-chip NRM test circuit 108 includes a programmable internal load capacitance provided by the capacitor circuit 622 and the switches 624 and includes a programmable resistance provided by the resistors 602 and the T-gates 604 controlled by the decoder 616. In one or more embodiments, the on-chip NRM test circuit 108 may include seven resistors (602(1), 602(2), ..., 602(7)) and seven T-gates (604(1), 604(2), 604(3), ..., 604(7)) to provide a variable series resistance. In one or more embodiments, the on-chip NRM test circuit 108 may include fewer or more resistors 602 and T-gates 604 to provide a predetermined granularity with respect to the negative resistance.

In one or more embodiments, in an application mode or operating mode, the switches 624 decouple the capacitor circuit 622 from the node 126. The amplifier circuit 106 may be coupled to the amplifier circuit 106 through the contact pad 520(2) in FIG. 5, such that the oscillating signal from the contact pad 510(1) is provided to the node 126 through the resistor 112(1) and the T-gate 612. The T-gates 604(1), 604(2), 604(3), ..., 604(7) are deactivated to decouple the resistors 602 from the signal path.

In one or more embodiments, in an NRM test mode, the T-gates 604(0) and 612 may be activated to provide a zero-ohm signal path from the contact pad to the node 126, the switch 402 may be opened to decouple the load capacitor 116(1) from the node 114(1), and one or more of the switches 624 may be activated to selectively couple one or more of the capacitors of the capacitor circuit 622 to the node 126. The oscillator 118 may use the load capacitance provided by the capacitor circuit 622 to produce the oscillating signal. The switches 624 may be controlled to selectively adjust the load capacitance until a frequency error of the output signal at the output 146 of the comparator 144 is approximately zero.

In one or more embodiments, the decoder 616 may be a three-to-eight (3:8) bit controller that may produce output signals on the outputs 620 to selectively couple one or more of the resistors 602 to the node 126. While calibrating the capacitance of the capacitor circuit 622 to minimize the frequency error to approximately zero, the decoder 616 may activate the T-gates 604(0) and 612 to provide a zero-ohm resistance. The on-resistance of the T-gates 604(0) and 612 may be approximately half of the on-resistance of the other T-gates 604.

In one or more embodiments, after the capacitance is configured, the control inputs 618 may turn off the T-gate 612 and may cause the decoder 616 to deactivate the T-gate 604(0). The control inputs at the input terminal 618 may cause the decoder 616 to selectively activate one of the one or more T-gates 604 to couple one or more of the resistors 602 in series with the node 126. Different ones of the T-gates 604 may be activated to control the resistance provided by one or more selected resistors 602. The resistors 602(1), 602(2), ..., 602(7) may have the same value (within a margin of error due to process variations), such that activating one of the T-gates provides a selected resistance. The control inputs at the input terminal 618 of the decoder 616 may cause the decoder 616 to vary the output signals on the output terminals 620 to adjust the resistance provided to the node 126 until the oscillating signal degrades.

Figure 7:
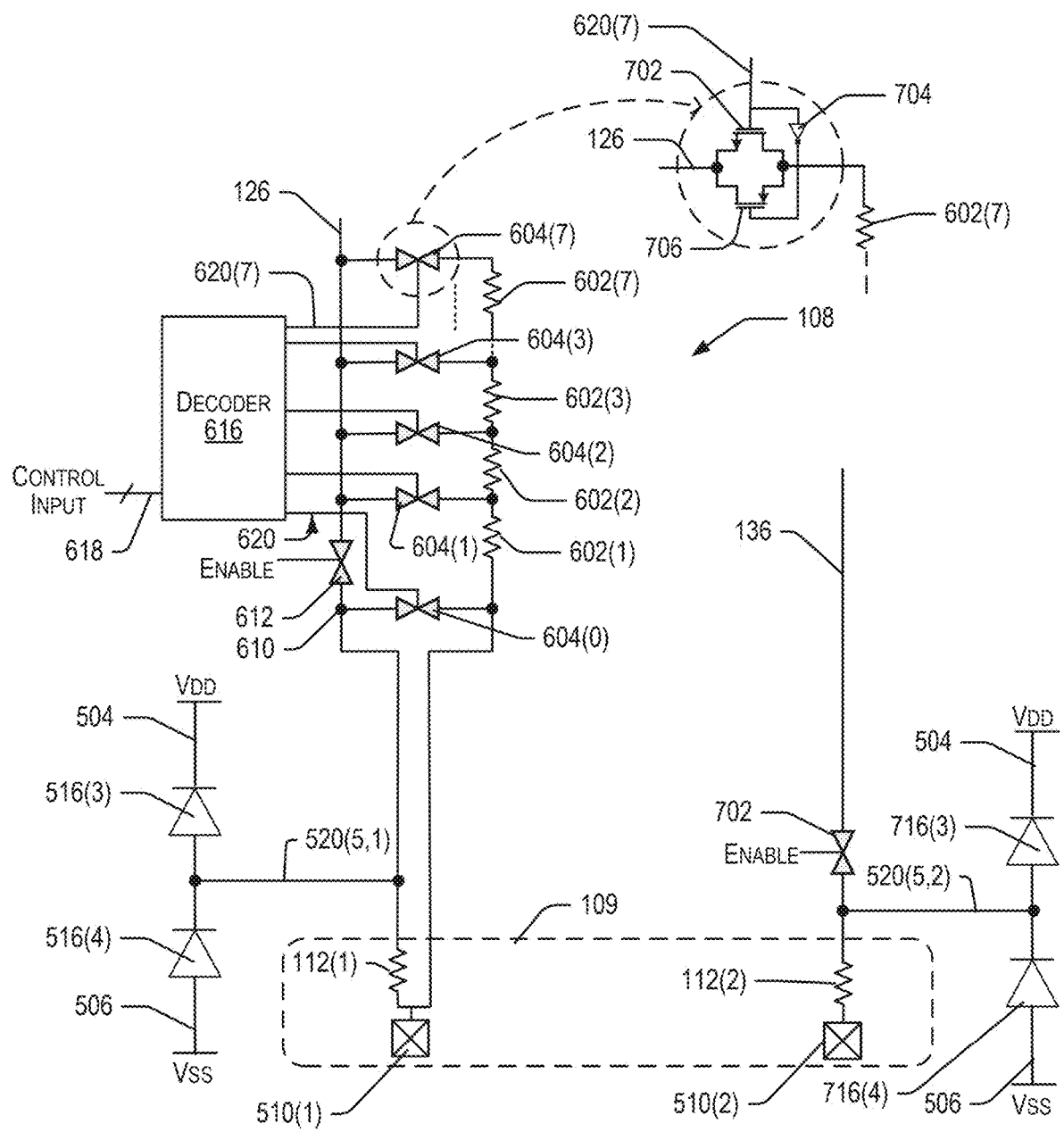
FIG. 7 depicts a portion of the interface of the integrated circuit of FIG. 6 including secondary electrostatic discharge (ESD) circuitry, in accordance with one or more embodiments of the present disclosure.

Since the circuit configuration enables zero-ohm path by activating the T-gates 604(0) and 612, there is an ESD constraint to prevent exposing on-chip transistors to ESD stress. Accordingly, the T-gates 604(0) and 612 are used in the signal path. Including two T-gates 604(0) and 612 in the zero-ohm path makes the design robust with respect to ESD events because the T-gates 604(0) and 612 are implemented as cascaded n-channel MOSFET and P-channel MOSFETs (as shown in FIG. 7).

During the NRM test, the decoder 616, the T-gate 604(0), and the T-gate 612 are enabled. In one or more embodiments, the decoder 616 is controlled to activate one gate 604 at a time from 604(1) to 604(7) to vary the resistance. In one or more embodiments, the decoder 616 may be three-bit decoder (a three-to-eight decoder). The control inputs (e.g., bits) may be controlled by a counter or a digital circuit in a loop that may control the decoder 616 to control the T-gates 604 sequentially and automatically. In one or more embodiments, the control inputs may be controlled to cause the decoder 616 to vary output signals on the output terminals 620 to sweep through the T-gates 604 from T-gate 604(0) through T-gate 604(7).

In one or more embodiments, the decoder 616 configures one path at a time during test, only one T-gate 604 is provided per resistor 602. In one or more embodiments, each of the resistors 602 may be approximately equal. To apply a single resistor as the negative resistance at the node 126, the T-gate 604(1) may be activated to establish an electrical signal path from the contact pad 510(1) through the resistor 602(1) and the T-gate 604(1) to the node 126. To increase the resistance, the decoder 616 may deactivate the T-gate 604(1) and activate the T-gate 604(2) to establish an electrical signal path from the contact pad 510(2) through the resistors 602(1) and 602(2) and through the T-gate 604(2) to the node 126. The decoder 616 may be controlled to cycle through the T-gates 604 until the oscillations degrade below a threshold amplitude. The selected resistance when the oscillations degrade represents the negative resistance. The oscillations may be monitored at the output 146 or across the nodes 126 and 136.

Once the negative resistance is determined and the NRM is determined, the integrated circuit 102 may be configured for an application mode or operating mode in which the T-gates 604 may be deactivated and the decoder 616 may be deactivated. In this mode, the T-gate 612 may be activated to provide an electrical signal path from the contact pad 510(1) through the T-gate 612 to the node 126 allowing the oscillating signal to be applied to the node 126.

In the illustrated embodiment, the zero-ohm path through the T-gate 604(0) and the T-gate 612 with secondary ESD diode protection can make the configuration robust with respect to ESD events. An example of a portion of the system 600 of FIG. 6 including ESD circuitry is described below with respect to FIG. 7.

FIG. 7 depicts a system 700 including a portion of the embodiment 600 of the system 400 of FIG. 4 including secondary ESD circuitry 514 (as shown in FIG. 5), in accordance with one or more embodiments of the present disclosure. In this example, the system 700 may include all the elements of the integrated circuit 102 in FIG. 6 and the interface of FIG. 5. In one or more embodiments, secondary ESD circuitry 514 may be provided on the integrated circuit 102 as part of the on-chip NRM test circuit 108 or as part of the interface of the integrated circuit 102. In one or more embodiments, the secondary ESD circuitry 514 may include diodes 516(3) and 516(4) and diodes 716(3) and 716(4), which are duplicates of the diodes 516(3) and 516(4) for the second contact pad 510(2).

The integrated circuit 102 may include a contact pad node 520(5,1) coupled to the bypass node 610 and to the anode of the diode 516(3), which may have an anode coupled to a first supply voltage (VDD) 504. The integrated circuit 502 may include a second diode 516(4) including an anode coupled to a second supply voltage (Vss) 506 and a cathode coupled to the node 520(5,1).

The integrated circuit 102 may include a diode 716(3) and a diode 716(4). The diode 716(3) may include an anode coupled to the node 520(5,2) and a cathode coupled to the first supply voltage (VDD) 504. The node 520(5,2) may be coupled to the second contact pad 510(2). The diode 716(4) may include an anode coupled to the second supply voltage (Vss) 506 and a cathode coupled to the node 520(5,2). In one or more embodiments, the integrated circuit 102 may include a T-gate 702 including a first terminal coupled to the node 520(5,2) and a second terminal coupled to the node 136. The secondary ESD circuitry 514 including the diodes 516(3), 516(4), 716(3), and 716(4) may protect against ESD events for the zero-ohm path.

In the illustrated embodiment, one of the T-gates 604(7) is shown in greater detail. In this example, the T-gate 604(7) may include an n-channel MOSFET 702 including a source coupled to the node 126, a gate coupled to an output 604(7) of the decoder 616, and a drain coupled to the resistor 602(7). The T-gate 604(7) may include a p-channel MOSFET 706 including a source coupled to the drain of the n-channel MOSFET 702, a gate coupled to the output 604(7) of the decoder 616 through an inverter 704, and a drain coupled to the node 126. In this embodiment, when the control signal at the output 604(7) enables the T-gate 604(7), both MOSFETs 702 and 706 are activated to conduct current from the signal path through the resistor 602(7) to the node 126.

Figure 8:
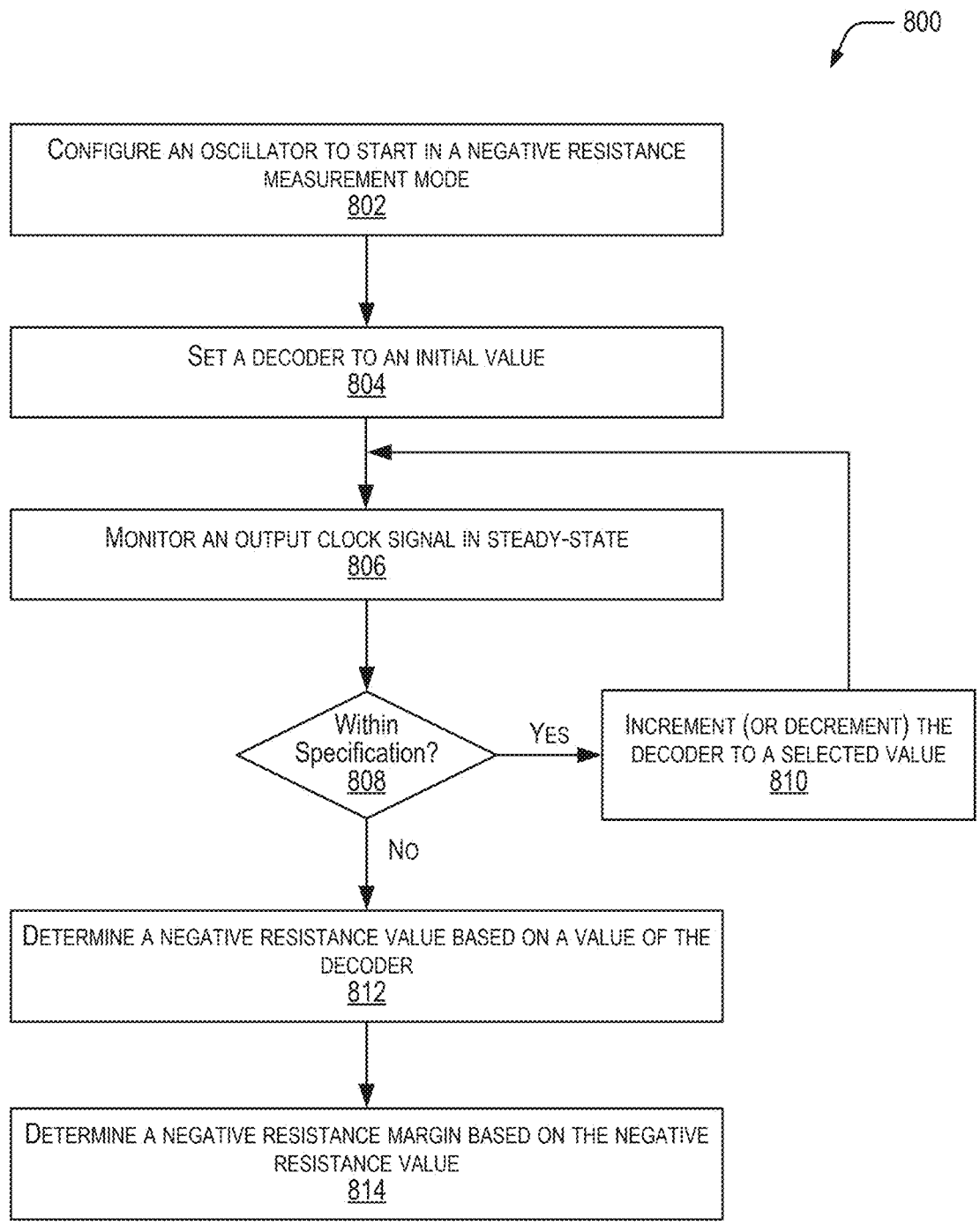
FIG. 8 depicts a flow diagram of a method of determining a negative resistance value, in accordance with an embodiment of the present disclosure.

FIG. 8 depicts a flow diagram of a method 800 of determining a negative resistance value, in accordance with an embodiment of the present disclosure. At 802, the method 800 may include configuring an oscillator circuit to start in an NRM test mode. In one or more embodiments, the oscillator circuit 414 may be configured for the NRM test mode by opening the switch 402 to decouple the load capacitor 116(1) from the node 114(1).

At 804, the method 800 may include setting a decoder to an initial value. In one or more embodiments, the decoder 616 may receive a control input 618 (in FIG. 6), which may cause the decoder 616 to provide a signal on a selected output 620 of the one or more outputs 620. In one or more embodiments, setting the decoder 616 to an initial value may cause the decoder 616 to provide a control signal on the control line 604(0) to activate the T-gate 604(0) to enable a zero-ohm resistance. In one or more embodiments, setting the decoder to the initial value may cause the decoder 616 to provide a control signal on the control line 620(0) to activate the t-gate 604(1) to provide a signal path from the control pad 510(1) through the resistor 602(0) through the T-gate 604(1) to the node 126.

At 806, the method 800 may include monitoring the output clock signal in a steady state. The clock signal may be monitored across the nodes 126 and 136 or at the output terminal 146 of the comparator 144. In one or more embodiments, the integrated circuit 102 may include a built-in clock self-test configured to monitor the oscillations of the output signal at the output terminal 146. In one or more embodiments, one or more analog-to-digital converter channels may be used to monitor the oscillations at the nodes 126 and 136.

At 808, if the clock is within specification, the method 800 may include incrementing (or decrementing) the decoder to a selected value, at 810. In one or more embodiments, the clock is within specification when the amplitude of the clock output signal is greater than a threshold amplitude. The clock is not within specification when the amplitude of the clock output signal is less than or equal to the threshold amplitude. In one or more embodiments, the threshold amplitude may be approximately zero volts or amperes because the oscillating signal has degraded or the oscillating signal fails. In one or more embodiments, the control inputs at the control input terminal 618 may be changed to change which output terminal 620 carries the control signal. In an example, the decoder 616 may receive a changed control input, causing the decoder 616 to deactivate T-gate 604(1) and to activate the T-gate 604(2). By activating the T-gate 604(2), the decoder 616 may enable an electrical signal path from the contact pad 510(1) through the resistors 602(0) and 602(1) and through the T-gate 604(2) to the node 126. The method 800 may then return to 806 to monitor the clock signal in the steady state. At 808, the method 800 again checks to see if the monitored clock signal is within the specification. If so, the control input value supplied to the control input 618 of the decoder 616 may be adjusted again, causing the decoder 616 to provide a control signal on a different output terminal 620 to activate a different one of the T-gates 604. Method blocks 810, 806, and 808 may be repeated iteratively until the monitored output signal is out of the specification, at 808.

At 808, if the monitored clock output signal is not within the specification, the method 800 may include determining a negative resistance value based on a value of the decoder 616, at 812. In one or more embodiments, the value of the resistors 602 may be equal such that the selected T-gate 604 determines the negative resistance value.

At 814, the method 800 may include determining a negative resistance margin based on the negative resistance value. The negative resistance margin may be the negative resistance value plus the resistance value of the resistors 112 representing the contact pads 510, and a resistance of the oscillator 118 represented by the resistor 120. The sum of the resistance values represents the negative resistance margin at which the oscillator 118 may function.

In the example embodiment described with respect to FIG. 8, the load capacitance is not discussed and the NRM may be determined based on the negative resistance value provided by the resistors 602. In one or more embodiments, the negative resistance value may be provided by a variable resistance circuit, such as the variable resistor 202, 302, or 404 in FIG. 2, 3, or 4.

In one or more embodiments, accuracy of the NRM determination may be further enhanced by controlling a load capacitance using an on-chip variable capacitor circuit, such as the capacitor circuit 406 in FIG. 4 or the capacitor circuit 622 and associated switches 624 in FIG. 6. An example of a method of determining the NRM using a variable on-chip capacitor circuit and a variable on-chip resistor circuit are described below with respect to FIG. 9.

Figure 9:
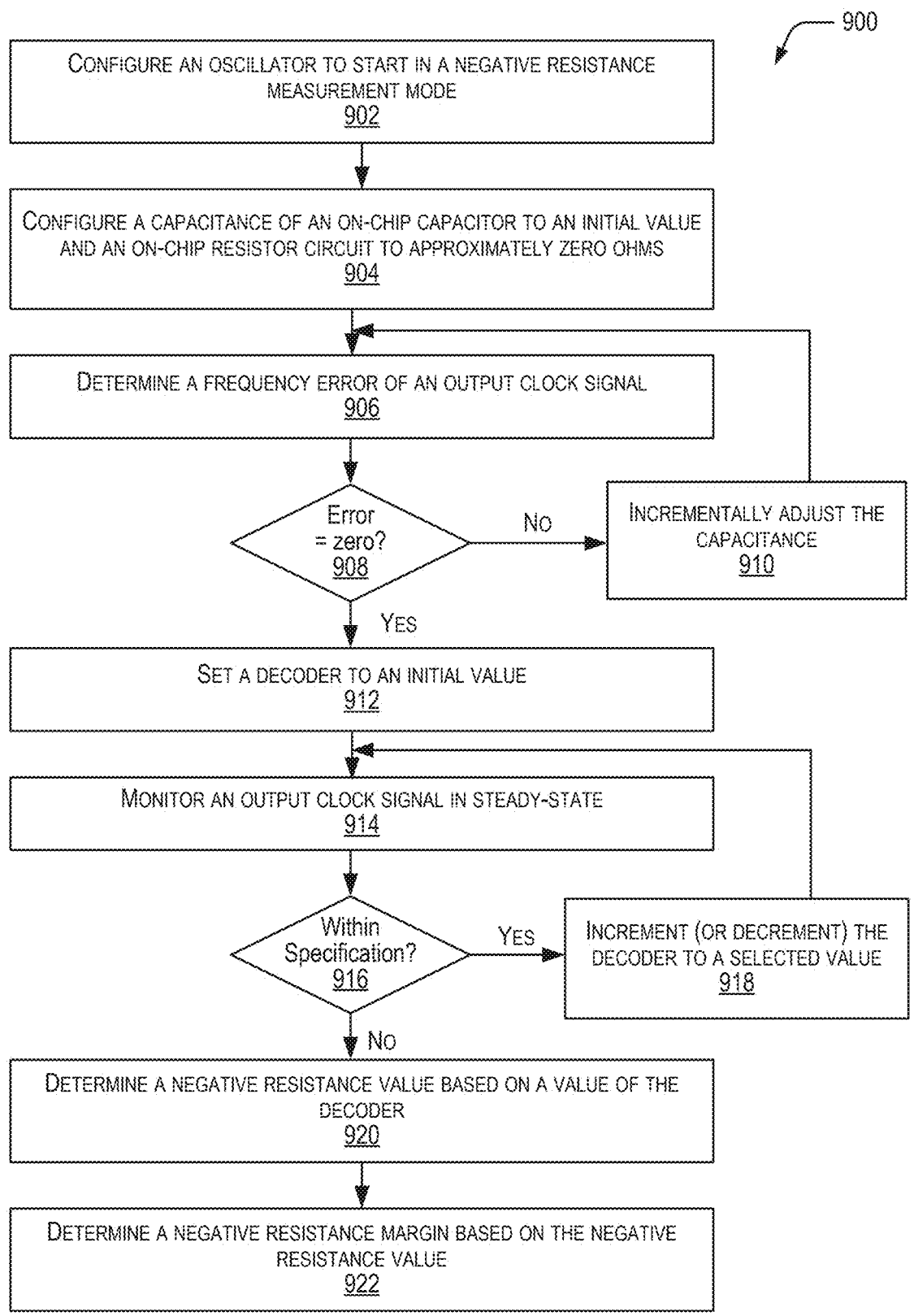
FIG. 9 depicts a flow diagram of a method of determining a negative resistance value, in accordance with an embodiment of the present disclosure.

FIG. 9 depicts a flow diagram of a method 900 of determining a negative resistance value, in accordance with an embodiment of the present disclosure. At 902, the method 900 may include configuring an oscillator circuit to start in an NRM test mode. In one or more embodiments, the oscillator circuit 414 may be configured for the NRM test mode by opening the switch 402 to decouple the load capacitor 116(1) from the node 114(1).

At 904, the method 900 may include configuring a capacitance of an on-chip capacitor to an initial value and an on-chip resistor circuit to approximately zero ohms. In one or more embodiments, the on-chip resistance may be configured to be approximately zero ohms, for example, by enabling a bypass signal path that is configured to bypass one or more resistors to couple the contact pad 510 to the node 126. In one or more embodiments, the on-chip NRM test circuit 108 may include a bypass signal path, such as the bypass signal path 410 in FIG. 4. In one or more embodiments, the on-chip NRM test circuit 108 may include a T-gate 604(0) and a T-gate 612 to provide a zero-ohm signal path that bypasses the resistors 602. Other implementations are also possible.

At 906, the method 900 may include determining a frequency error of an output clock signal. The output clock signal may be determined at an output terminal 146 of the comparator 144 or across the nodes 126 and 136. The frequency error may be a non-zero offset between the signal from the oscillator 118 and the measured signal.

At 908, if the frequency error is not equal to zero, the method 900 may include incrementally adjusting the capacitance, at 910. In one or more embodiments, the capacitance may be adjusted by selectively closing one or more of the switches 624 to selectively couple one or more of the capacitors 622 to the node 126. In one or more embodiments, a variable capacitor 406 may be adjusted to provide the selected capacitance. The method 900 may then return to 906 to determine the frequency error of the output clock signal.

Otherwise, at 908, if the frequency error is approximately zero, the method 900 may include setting a decoder 616 to an initial value, at 912. In one or more embodiments, the decoder 616 may be configured by one or more control inputs received on the control input terminal 618. The control inputs may include a codeword or a multibit code that may cause the decoder 616 to provide an output signal on one or more output terminals 620 to enable a signal path through one or more resistors 602. In one or more embodiments, setting the decoder 616 to an initial value may cause the decoder 616 to provide a control signal on the control line 604(0) to activate the T-gate 604(0) to enable a zero-ohm resistance. In one or more embodiments, setting the decoder to the initial value may cause the decoder 616 to provide a control signal on the control line 620(1) to activate the t-gate 604(1) to provide a signal path from the control pad 510(1) through the resistor 602(1) through the T-gate 604(1) to the node 126.

At 914, the method 900 may include monitoring the output clock signal in a steady state. The clock signal may be monitored across the nodes 126 and 136 or at the output terminal 146 of the comparator 144. In one or more embodiments, the integrated circuit 102 may include a built-in clock self-test configured to monitor the oscillations of the output signal at the output terminal 146. In one or more embodiments, one or more analog-to-digital converter channels may be used to monitor the oscillations at the nodes 126 and 136.

At 916, if the clock is within specification, the method 900 may include incrementing (or decrementing) the decoder 616 to a selected value, at 918. In one or more embodiments, the clock is within specification when the amplitude of the clock output signal is greater than a threshold amplitude. The clock is not within specification when the amplitude of the clock output signal is less than or equal to the threshold amplitude or when the amplitude of the oscillations degrades to approximately zero. In one or more embodiments, the threshold amplitude may be approximately zero volts or amperes because the oscillating signal has degraded or the oscillating signal fails. In one or more embodiments, the control inputs (code, codeword, etc.) at the control input terminal 618 may be changed, causing the decoder 616 to change control signals applied to one or more of the output terminals 620. In an example, the decoder 616 may receive a changed control input at the input terminal 618, causing the decoder 616 to deactivate T-gate 604(1) and to activate the T-gate 604(2). By activating the T-gate 604(2), the decoder 616 may enable an electrical signal path from the contact pad 510(1) through the resistors 602(1) and 602(2) and through the T-gate 604(2) to the node 126.

The method 900 may then return to 914 to monitor the clock signal in the steady state. At 916, the method 900 again checks to see if the monitored clock signal is within the specification. If so, the control input value supplied to the control input 618 of the decoder 616 may again be adjusted (at 918), causing the decoder 616 to provide a control signal on a different output terminal 620 to activate a different one of the T-gates 604. Method blocks 918, 914, and 916 may be repeated iteratively until the monitored output signal is out of the specification, at 916.

At 916, if the monitored clock output signal is not within the specification, the method 900 may include determining a negative resistance value based on a value of the decoder 616, at 920. In one or more embodiments, the value of the resistors 602 may be equal such that the selected T-gate 604 determines the negative resistance value.

At 922, the method 900 may include determining a negative resistance margin based on the negative resistance value. The negative resistance margin may be the negative resistance value plus the resistance value of the resistors 112 representing the contact pads 510, and a resistance of the oscillator 118 represented by the resistor 120. The sum of the resistance values represents the negative resistance margin at which the oscillator 118 may function.

The embodiments of the methods 800 and 900 in FIGS. 8 and 9 are provided for illustrative purposes only. In one or more embodiments, steps of the methods 800 or 900 may be combined, one or more steps may be omitted, or one or more steps may be added without departing from the scope of the disclosure. In one or more embodiments, in method 800, the decoder may be set to an initial value (804) prior to or at the same time as configuring the oscillator to start in a negative resistance measurement mode (802). In one or more embodiments, the negative resistance margin may be determined (814 or 922) at the same time as the negative resistance value is determined (812 or 920). In one or more embodiments, in the method 900, the decoder may be set to an initial value (912) before or at the same time as configuring the oscillator (902) or before configuring the capacitor (904). Other variations are also possible.

Figure 10:
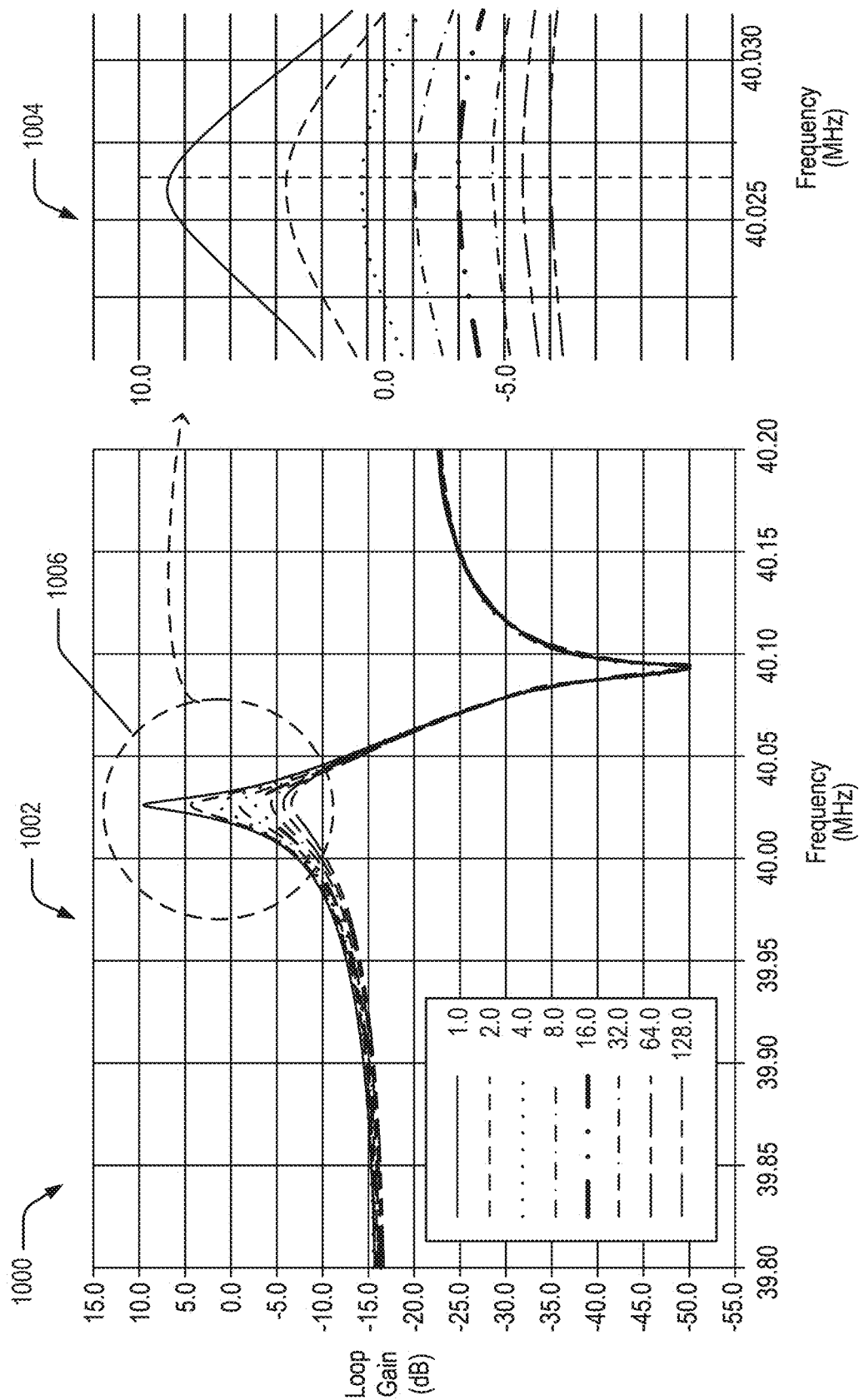
FIG. 10 depicts a graph of the loop gain in decibels (dB) versus frequency in megahertz (MHz) for different values of the negative resistance margin for the system in FIG. 6, in accordance with an embodiment of the present disclosure.

FIG. 10 depicts a graph 1000 of the loop gain in decibels (dB) versus frequency in megahertz (MHz) for different values of the negative resistance margin for the system in FIG. 6, in accordance with an embodiment of the present disclosure. In this example, the loop gain is shown for the variable resistance margin, and the resistance of the resistor 120 of the oscillator 118 is fifty ohms (50Ω).

In the illustrated graph 1000, the system 600 of FIG. 6 is configured such that the zero-ohm path is used to determine a load capacitance that provides a frequency error of approximately zero. Once the capacitance is configured, the decoder 616 is programmed to couple the contact pad 510 to the node 126 through one or more selected resistors, for example, by sweeping through the various decoder inputs at the input terminal 618 to vary the negative resistance provided by the resistors 602 (in FIG. 6).

In one or more embodiments, the decoder 616 may be a three-to-eight decoder, and input data can be varied from a value of zero to a value of seven, causing the decoder 616 to change the output signals provided to the one or more outputs 620, varying the resistance. The graph 1000 shows that the digital input of 3b'100 (corresponding to value of 16 for the decoder 616), the loop gain is less than zero decibels (<0 dB). Thus, the negative resistance of the amplifier 106 can be determined based on the value of the series resistors 602 when the loop gain becomes negative.

In one or more embodiments, a method of determining a negative resistance margin (NRM) of an oscillator circuit, the method may include providing an integrated circuit including an amplifier circuit coupled between a first node and a second node, the integrated circuit including NRM test circuitry including a resistor circuit selectively coupled between a first contact pad and the first node; receiving, at the integrated circuit, an oscillating signal from an oscillator circuit coupled to the first contact pad and a second contact pad of the integrated circuit; in an NRM test mode, selectively varying a resistance of the resistor circuit from an initial resistance value to one or more second resistance values; and monitoring the oscillating signal at the second node to determine the NRM based on the one or more second resistance values when an amplitude of the oscillating signal falls below a threshold amplitude.

In one or more embodiments, prior to selectively varying the resistance of the resistor circuit, the method may include configuring the resistance of the initial resistance value to a zero-ohm resistance value. In one or more embodiments, the NRM test circuit includes a capacitor circuit coupled between the first node and one of electrical ground or a negative supply voltage; and in the NRM mode and prior to selectively varying the resistance, the method may include selectively varying a capacitance of the capacitor circuit; determining a frequency error of the oscillating signal at the second node; and determining a selected capacitance of the capacitor circuit based on the selectively varied capacitance when the frequency error is zero.

In one or more embodiments, in an operating mode, the method may include selectively enabling a bypass signal path between the contact pad and the first node to bypass the capacitor circuit and the resistor circuit. In one or more embodiments, enabling the bypass signal path may include activating a first T-gate coupled between the first contact pad and a bypass node; and activating a second T-gate coupled between the bypass node and the first node; wherein the first T-gate and the second T-gate in series provide electrostatic discharge protection.

In one or more embodiments, selectively varying the capacitance of the capacitor circuit may include selectively enabling a first switch coupled between a first capacitor and the first node to provide a first capacitance; and selectively enabling a second switch coupled between a second capacitor and the first node to provide a second capacitance. In one or more embodiments, selectively varying the resistance of the resistor circuit may include providing an input data signal to a decoder circuit of the integrated circuit, the decoder circuit configured to control the resistance of the resistor circuit in response to the input data.

In one or more embodiments, the resistor circuit comprises a plurality of resistors arranged in series, each resistor including a first terminal and a second terminal, the plurality of resistors including a first resistor including a first terminal coupled to the first contact pad and including a second terminal, the plurality of resistors including a second resistor including a first terminal coupled to the second terminal of the first resistor and including a second terminal; the NRM test circuitry comprises a plurality of switches, each switch including a first terminal coupled to a second terminal of one of the plurality of resistors, a second terminal coupled to the first node, and a control terminal coupled to one of a plurality of output terminals of the decoder, the method may include: selectively applying a first control signal to a first output terminal of the plurality of output terminals to provide a first signal path having a first resistance from the contact pad to the first node; and selectively applying a second control signal to a second output terminal of the plurality of output terminals to provide a second signal path having a second resistance from the first contact pad to the first node.

In one or more embodiments, a semiconductor device may include an integrated circuit including: an amplifier circuit including an input node and an output node; an analog interface configured to couple to an oscillator circuit; and negative resistance margin (NRM) test circuitry coupled between the analog interface and one or more of the input node or the output node, the NRM test circuitry including: a capacitor circuit selectively coupled to the input node; and a resistor circuit selectively coupled to the input node and configured to provide a tunable resistance that is selectively applied to the input node until an amplitude of oscillations of the oscillator circuit are less than a threshold amplitude indicative of a negative resistance of the amplifier circuit.

In one or more embodiments, the oscillator circuit may include a first node coupled to the analog interface; a second node coupled to the analog interface; an oscillator coupled between the first node and the second node; a switch including a first terminal coupled to the first node and including a second terminal; a first load capacitor including a first terminal coupled to the second terminal of the switch and including a second terminal coupled to one of electrical ground or a negative supply voltage; and a second load capacitor including a first terminal coupled to the second node and including a second terminal coupled to the one of the electrical ground or the negative supply voltage. In one or more embodiments, in an NRM test mode, the switch decouples the first load capacitor from the first node; and in an application mode or operating mode, the switch couples the first load capacitor to the first node. In one or more embodiments, the capacitor circuit is configurable to provide a selected capacitance.

In one or more embodiments, the analog interface may include a first contact pad and a second contact pad; the resistor circuit may include a plurality of resistors arranged in series, each resistor including a first terminal and a second terminal; the NRM test circuitry may include a decoder including an input terminal to receive control data and a plurality of output terminals, the decoder configured to selectively apply a control signal to one of the plurality of output terminals based on the control data; and a plurality of T-gates, each T-gate including a first terminal coupled to the input node of the amplifier circuit, a control terminal coupled to one of the plurality of output terminals of the decoder, and a second terminal coupled to one of the plurality of resistors, each T-gate configured to provide a conductive path from the first terminal to the second terminal in response to receiving the control signal.

In one or more embodiments, the plurality of resistors may include a first resistor including a first terminal coupled to the first contact pad and including a second terminal; a second resistor including a first terminal coupled to the second terminal of the first resistor and including a second terminal; and the plurality of T-gates may include a first T-gate including a first terminal coupled to the input node, a control terminal coupled to a first output terminal of the plurality of output terminals of the decoder, and a second terminal coupled to the second terminal of the first resistor; and a second T-gate including a first terminal coupled to the input node, a control terminal coupled to a second output terminal of the plurality of output terminals of the decoder, and a second terminal coupled to the second terminal of the second resistor; and the decoder is configured to selectively activate one of the first T-gate or the second T-gate to provide a selected signal path through the first resistor or the first resistor and the second resistor, respectively.

In one or more embodiments, the plurality of T-gates may include a third T-gate including a first terminal coupled to a bypass node, a control terminal coupled to a third output terminal of the plurality of output terminals of the decoder, and a second terminal coupled to the first terminal of the first resistor; and a fourth T-gate including a first terminal coupled to the first node, a second terminal coupled to the bypass node, and a control terminal configured to receive an NRM test enable signal.

In one or more embodiments, during an application mode or an operating mode, the third T-gate and the fourth T-gate may provide a bypass signal path from the first contact pad to the first node that bypasses the resistor circuit. In one or more embodiments, during an NRM test mode, the decoder is configured to activate the third T-gate to provide a first signal path from the first contact pad to the bypass node; deactivate the third T-gate and activate the second T-gate to provide a second signal path from the first contact pad and through the first resistor to the first node; and deactivate the second T-gate and activate the third T-gate to provide a third signal path from the first contact pad and through the first resistor and the second resistor to the first node.

In one or more embodiments, a semiconductor device may include an amplifier circuit coupled between a first node and a second node; a first contact pad configured to be coupled to an oscillator circuit; a second contact pad configured to be coupled to the oscillator circuit; and negative resistance margin (NRM) test circuitry coupled between the first contact pad and the first node, the NRM test circuitry including: a capacitor circuit selectively coupled to the input node in an NRM test mode and configurable to provide a selected capacitance to the first node to produce a frequency error of zero at the second node; and a resistor circuit selectively coupled to the input node in the NRM test mode and configured to provide a tunable resistance that is selectively applied to the input node and incrementally adjusted until an amplitude of oscillations of the oscillator circuit are less than a threshold amplitude indicative of a negative resistance of the amplifier circuit.

In one or more embodiments, the capacitor circuit may include a plurality of capacitors, each capacitor including a first terminal coupled to electrical ground or to a negative supply voltage (Vss) and including a second terminal; and a plurality of switches, each switch including a first terminal coupled to the second terminal of one of the plurality of capacitors and including a second terminal coupled to the input node; and each switch of the plurality of switches is responsive to a control signal to selectively couple one or more of the capacitors of the plurality of capacitors to the input node to provide a load capacitance during the NRM test mode.

In one or more embodiments, the resistor circuit may include a plurality of resistors arranged in series, the plurality of resistors including a first resistor and a second resistor, the first resistor including a first terminal coupled to the contact pad and including a second terminal, the second resistor including a first terminal coupled to the second terminal of the first resistor and including a second terminal; the NRM test circuitry may include a decoder including an input terminal and including a plurality of output terminals, the plurality of output terminals including a first output terminal, a second output terminal, and a third output terminal; a plurality of T-gates including: a first T-gate including a first terminal coupled to the contact pad, a second terminal coupled to a bypass node, and a control terminal coupled to the first output terminal; a second T-gate including a first terminal coupled to the bypass node, a second terminal coupled to the input node, and a control terminal configured to receive an enable signal; a third T-gate including a first terminal coupled to the second terminal of the first resistor, a second terminal coupled to the input node, and a control terminal coupled to the second output terminal of the decoder; and a fourth T-gate including a first terminal coupled to the second terminal of the second resistor, a second terminal coupled to the input node, and a control terminal coupled to the third output terminal of the decoder; and in an application mode or an operating mode, the decoder is configured to enable a bypass signal path having a zero-ohm resistance from the first contact pad through the first T-gate and the second T-gate to the input node; and in an NRM test mode, the decoder is configured to enable a signal path through one of the third T-gate or the fourth T-gate to vary a resistance.

In some embodiments, methods and semiconductor devices are described that are configured to determine a negative resistance margin (NRM) of an oscillator circuit. The semiconductor device may include an integrated circuit including an amplifier circuit coupled between a first node and a second node and NRM test circuitry including a resistor circuit selectively coupled between a first contact pad and the first node. The integrated circuit may receive an oscillating signal from an oscillator circuit coupled to the first contact pad and a second contact pad of the integrated circuit. In an NRM test mode, a resistance of the resistor circuit is selectively varied from an initial resistance value to one or more second resistance values and the oscillating signal is monitored at the second node to determine the NRM based on the one or more second resistance values when an amplitude of the oscillating signal falls below a threshold amplitude.

The preceding detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, or detailed description.

The connecting lines shown in the various figures contained herein are intended to represent exemplary functional relationships and/or physical couplings between the various elements. It should be noted that many alternative or additional functional relationships or physical connections may be present in an embodiment of the subject matter. In addition, certain terminology may also be used herein for the purpose of reference only, and thus are not intended to be limiting, and the terms "first", "second" and other such numerical terms referring to structures do not imply a sequence or order unless clearly indicated by the context.

The foregoing description refers to elements or features being "connected" or "coupled" together. As used herein, unless expressly stated otherwise, "connected" means that one element is directly joined to (or directly communicates with) another element, and not necessarily mechanically. Likewise, unless expressly stated otherwise, "coupled" means that one element is directly or indirectly joined to (or directly or indirectly communicates with, electrically or otherwise) another element, and not necessarily mechanically. Thus, although the schematic shown in the figures depict one exemplary arrangement of elements, additional intervening elements, devices, features, or components may be present in an embodiment of the depicted subject matter.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

We claim:

1. A method of determining a negative resistance margin (NRM) of an oscillator circuit, the method comprising:
   providing an integrated circuit including an amplifier circuit coupled between a first node and a second node, the integrated circuit including NRM test circuitry including a resistor circuit selectively coupled between a first contact pad and the first node;
   receiving, at the integrated circuit, an oscillating signal from an oscillator circuit coupled to the first contact pad and a second contact pad of the integrated circuit;
   in an NRM test mode, selectively varying a resistance of the resistor circuit from an initial resistance value to one or more second resistance values; and
   monitoring the oscillating signal at the second node to determine the NRM based on the one or more second resistance values when an amplitude of the oscillating signal falls below a threshold amplitude; and
   wherein, in an operating mode, the method comprises selectively enabling a bypass signal path between the first contact pad and the first node to bypass the resistor circuit.

2. The method of claim 1, wherein, prior to selectively varying the resistance of the resistor circuit, the method comprises configuring the resistance of the initial resistance value to a zero-ohm resistance value.

3. The method of claim 1, wherein enabling the bypass signal path comprises:

activating a first T-gate coupled between the first contact pad and a bypass node; and
   activating a second T-gate coupled between the bypass node and the first node; and
   wherein the first T-gate and the second T-gate in series provide electrostatic discharge protection.

4. The method of claim 1, wherein:
   the NRM test circuitry includes a capacitor circuit coupled between the first node and one of electrical ground or a negative supply voltage; and
   in the NRM mode and prior to selectively varying the resistance, the method comprising:
   selectively varying a capacitance of the capacitor circuit;
   determining a frequency error of the oscillating signal at the second node; and
   determining a selected capacitance of the capacitor circuit based on the selectively varied capacitance when the frequency error is zero.

5. The method of claim 4, wherein selectively varying the capacitance of the capacitor circuit comprises:
   selectively enabling a first switch coupled between a first capacitor and the first node to provide a first capacitance; and
   selectively enabling a second switch coupled between a second capacitor and the first node to provide a second capacitance.

6. The method of claim 1, wherein selectively varying the resistance of the resistor circuit comprises providing an input data signal to a decoder circuit of the integrated circuit, the decoder circuit configured to control the resistance of the resistor circuit in response to the input data signal.

7. The method of claim 6, wherein:
   the resistor circuit comprises a plurality of resistors arranged in series, each resistor including a first terminal and a second terminal, the plurality of resistors including a first resistor including a first terminal coupled to the first contact pad and including a second terminal, the plurality of resistors including a second resistor including a first terminal coupled to the second terminal of the first resistor and including a second terminal;
   the NRM test circuitry comprises a plurality of switches, each switch including a first terminal coupled to a second terminal of one of the plurality of resistors, a second terminal coupled to the first node, and a control terminal coupled to one of a plurality of output terminals of the decoder circuit, the method further comprises:
   selectively applying a first control signal to a first output terminal of the plurality of output terminals to provide a first signal path having a first resistance from the contact pad to the first node; and
   selectively applying a second control signal to a second output terminal of the plurality of output terminals to provide a second signal path having a second resistance from the first contact pad to the first node.

8. A semiconductor device comprises:
   an integrated circuit comprising:
   an amplifier circuit including an input node and an output node;
   an analog interface configured to couple to an oscillator circuit; and
   negative resistance margin (NRM) test circuitry coupled between the analog interface and one or more of the input node or the output node, the NRM test circuitry including:

a capacitor circuit selectively coupled to the input node; and a resistor circuit selectively coupled to the input node and configured to provide a tunable resistance that is selectively applied to the input node until an amplitude of oscillations of the oscillator circuit are less than a threshold amplitude indicative of a negative resistance of the amplifier circuit.

9. The semiconductor device of claim 8, further comprising the oscillator circuit comprising:
a first node coupled to the analog interface;
a second node coupled to the analog interface;
an oscillator coupled between the first node and the second node;
a switch including a first terminal coupled to the first node and including a second terminal;
a first load capacitor including a first terminal coupled to the second terminal of the switch and including a second terminal coupled to one of electrical ground or a negative supply voltage; and
a second load capacitor including a first terminal coupled to the second node and including a second terminal coupled to the one of the electrical ground or the negative supply voltage.

10. The semiconductor device of claim 9, wherein:
in an NRM test mode, the switch decouples the first load capacitor from the first node; and
in an application mode or operating mode, the switch couples the first load capacitor to the first node.

11. The semiconductor device of claim 8, wherein the capacitor circuit is configurable to provide a selected capacitance.

12. The semiconductor device of claim 8, wherein:
the analog interface includes a first contact pad and a second contact pad;
the resistor circuit comprises a plurality of resistors arranged in series, each resistor including a first terminal and a second terminal; and
the NRM test circuitry includes:
a decoder including an input terminal to receive control data and a plurality of output terminals, the decoder configured to selectively apply a control signal to one of the plurality of output terminals based on the control data; and
a plurality of T-gates, each T-gate including a first terminal coupled to the input node of the amplifier circuit, a control terminal coupled to one of the plurality of output terminals of the decoder, and a second terminal coupled to one of the plurality of resistors, each T-gate configured to provide a conductive path from the first terminal to the second terminal in response to receiving the control signal.

13. The semiconductor device of claim 12, wherein:
the plurality of resistors comprises:
a first resistor including a first terminal coupled to the first contact pad and including a second terminal; and
a second resistor including a first terminal coupled to the second terminal of the first resistor and including a second terminal; and
the plurality of T-gates comprises:
a first T-gate including a first terminal coupled to the input node, a control terminal coupled to a first output terminal of the plurality of output terminals of the decoder, and a second terminal coupled to the second terminal of the first resistor; and
a second T-gate including a first terminal coupled to the input node, a control terminal coupled to a second output terminal of the plurality of output terminals of the decoder, and a second terminal coupled to the second terminal of the second resistor; and
wherein the decoder is configured to selectively activate one of the first T-gate or the second T-gate to provide a selected signal path through the first resistor or the first resistor and the second resistor, respectively.

14. The semiconductor device of claim 13, wherein the plurality of T-gates comprises:
a third T-gate including a first terminal coupled to a bypass node, a control terminal coupled to a third output terminal of the plurality of output terminals of the decoder, and a second terminal coupled to the first terminal of the first resistor; and
a fourth T-gate including a first terminal coupled to the input node, a second terminal coupled to the bypass node, and a control terminal configured to receive an NRM test enable signal.

15. The semiconductor device of claim 14, wherein, during an application mode or an operating mode, the third T-gate and the fourth T-gate to provide a bypass signal path from the first contact pad to the input node that bypasses the resistor circuit.

16. The semiconductor device of claim 14, wherein, during an NRM test mode, the decoder is configured to:
activate the third T-gate to provide a first signal path from the first contact pad to the bypass node;
deactivate the third T-gate and activate the second T-gate to provide a second signal path from the first contact pad and through the first resistor to the input node; and
deactivate the second T-gate and activate the third T-gate to provide a third signal path from the first contact pad and through the first resistor and the second resistor to the input node.

17. A semiconductor device comprising:
an amplifier circuit coupled between an input node and an output node;
a first contact pad configured to be coupled to an oscillator circuit;
a second contact pad configured to be coupled to the oscillator circuit; and
negative resistance margin (NRM) test circuitry coupled between the first contact pad and the input node, the NRM test circuitry comprising:
a capacitor circuit selectively coupled to the input node in an NRM test mode and configurable to provide a selected capacitance to the input node to produce a frequency error of zero at the output node; and
a resistor circuit selectively coupled to the input node in the NRM test mode and configured to provide a tunable resistance that is selectively applied to the input node and incrementally adjusted until an amplitude of oscillations of the oscillator circuit are less than a threshold amplitude indicative of a negative resistance of the amplifier circuit.

18. The semiconductor device of claim 17, wherein the capacitor circuit comprises:
a plurality of capacitors, each capacitor including a first terminal coupled to electrical ground or to a negative supply voltage (Vss) and including a second terminal; and
a plurality of switches, each switch including a first terminal coupled to the second terminal of one of the plurality of capacitors and including a second terminal coupled to the input node; and wherein each switch of the plurality of switches is responsive to a control signal to selectively couple one or more of the capacitors of the plurality of capacitors to the input node to provide a load capacitance during the NRM test mode.

19. The semiconductor device of claim 17, wherein:

the resistor circuit comprises a plurality of resistors arranged in series, the plurality of resistors including a first resistor and a second resistor, the first resistor including a first terminal coupled to the contact pad and including a second terminal, the second resistor including a first terminal coupled to the second terminal of the first resistor and including a second terminal;

the NRM test circuitry comprises:
- a decoder including an input terminal and including a plurality of output terminals, the plurality of output terminals including a first output terminal, a second output terminal, and a third output terminal;
- a plurality of T-gates including:
  - a first T-gate including a first terminal coupled to the contact pad, a second terminal coupled to a bypass node, and a control terminal coupled to the first output terminal;
  - a second T-gate including a first terminal coupled to the bypass node, a second terminal coupled to the input node, and a control terminal configured to receive an enable signal;
  - a third T-gate including a first terminal coupled to the second terminal of the first resistor, a second terminal coupled to the input node, and a control terminal coupled to the second output terminal of the decoder; and
  - a fourth T-gate including a first terminal coupled to the second terminal of the second resistor, a second terminal coupled to the input node, and a control terminal coupled to the third output terminal of the decoder; and in an application mode or an operating mode, the decoder is configured to enable a bypass signal path having a zero-ohm resistance from the first contact pad through the first T-gate and the second T-gate to the input node; and in an NRM test mode, the decoder is configured to enable a signal path through one of the third T-gate or the fourth T-gate to vary a resistance.

* * * * *